(12) United States Patent
Suzuki et al.

(10) Patent No.: US 6,271,909 B1
(45) Date of Patent: Aug. 7, 2001

(54) EXPOSURE APPARATUS AND DEVICE MANUFACTURING METHOD INCLUDING CHANGING A PHOTO-INTENSITY DISTRIBUTION OF A LIGHT SOURCE AND ADJUSTING AN ILLUMINANCE DISTRIBUTION ON A SUBSTRATE IN ACCORDANCE WITH THE CHANGE

(75) Inventors: Akiyoshi Suzuki; Miyoko Noguchi, both of Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 08/427,709

(22) Filed: Apr. 24, 1995

Related U.S. Application Data

(63) Continuation of application No. 08/357,786, filed on Dec. 16, 1994, now abandoned, which is a continuation of application No. 08/270,414, filed on Jul. 5, 1994, now abandoned, which is a continuation of application No. 08/159,954, filed on Dec. 1, 1993, now abandoned, which is a continuation of application No. 08/065,498, filed on May 24, 1993, now abandoned, which is a division of application No. 07/836,509, filed on Feb. 18, 1992, now Pat. No. 5,305,054.

(30) Foreign Application Priority Data

Feb. 22, 1991 (JP) .................................................. 3-028631
Apr. 30, 1991 (JP) .................................................. 3-128446

(51) Int. Cl.[7] ............................ G03B 27/42; G03B 27/72
(52) U.S. Cl. .................................................. 355/53; 355/71
(58) Field of Search ................................. 355/53, 67, 68, 355/70, 71

(56) References Cited

U.S. PATENT DOCUMENTS

| 3,729,252 | 4/1973 | Nelson | 350/162 |
| 3,776,633 | 12/1973 | Frosch et al. | 355/132 |

(List continued on next page.)

FOREIGN PATENT DOCUMENTS

| 2835363 | 8/1978 | (DE) . | |
| 3933308 | 10/1988 | (DE) . | |
| 0 293 643 | 12/1988 | (EP) . | |
| 0 346 844 | 12/1989 | (EP) . | |
| 0437376 | 7/1991 | (EP) . | |
| 61-91662 | * 5/1986 | (JP) | ........................................ 355/53 |
| 61-210627 | 9/1986 | (JP) . | |
| 61-91662 | 9/1986 | (JP) . | |

OTHER PUBLICATIONS

Victor Pol, et al., "Excimer Laser Based Lithography: A Deep–Ultraviolet Wafer Stepper for VLSI Processing", *Optical Engineering*, vol. 26, No. 4, pp. 311–318, Apr. 1987.

S.T. Yang, et al., "Effect of Central Obscuration on Image Formation in Projection Lithography", *SPIE vol. 1264 Optical/Laser Microlithography III*, pp. 477–485, 1990.

Hecht & Zajac, *Optics*, 1st Edition, p. 117, 1974.

*Int. Cl.*, 5th Edition, vol. 7, Section G, pp. 68 and 72, 1989.

E. Glatzel, "New Lenses for Microlithography", *SPIE*, vol. 237, p. 310, International Lens Design Conference (OSA), 1980.

Affidavit of Robert E. Fischer in the opposition to EP 0183827 by Canon KK, 1994.

\* cited by examiner

*Primary Examiner*—Fred L Braun
(74) *Attorney, Agent, or Firm*—Fitzpatrick, Cella, Harper & Scinto

(57) ABSTRACT

An exposure apparatus and a device manufacturing method for transferring a device pattern on a substrate by illuminating the device pattern with light from a light source include features of changing a photointensity distribution of the light source and adjusting an illuminance distribution on the substrate in accordance with a change of the photointensity distribution.

32 Claims, 19 Drawing Sheets

U.S. PATENT DOCUMENTS

| | | | |
|---|---|---|---|
| 3,887,816 | 6/1975 | Colley | 250/571 |
| 4,497,015 | 1/1985 | Konno et al. | 362/268 |
| 4,521,082 | 6/1985 | Suzuki et al. | 350/405 |
| 4,634,240 | 1/1987 | Suzuki et al. | 350/508 |
| 4,645,924 | 2/1987 | Suzuki et al. | 250/236 |
| 4,668,077 * | 5/1987 | Tanaka | 355/53 X |
| 4,780,747 * | 10/1988 | Suzuki et al. | 355/53 X |
| 4,851,882 * | 7/1989 | Takahashi et al. | 355/67 X |
| 4,924,257 | 5/1990 | Jain | 355/53 |
| 4,931,830 | 6/1990 | Suwa et al. | 355/71 |
| 4,947,030 | 8/1990 | Takahashi | 250/201.1 |
| 4,988,188 | 1/1991 | Ohta | 353/122 |
| 5,061,956 | 10/1991 | Takubo et al. | 355/55 |
| 5,119,390 * | 6/1992 | Ohmori | 355/53 X |
| 5,144,362 | 9/1992 | Kamon et al. | 355/53 |
| 5,153,419 | 10/1992 | Takahashi | 250/201.1 |
| 5,160,962 * | 11/1992 | Miura et al. | 355/53 |
| 5,237,367 * | 8/1993 | Kudo | 355/67 |
| 5,245,384 * | 9/1993 | Mori | 355/67 |
| 5,251,067 * | 10/1993 | Kamon | 359/628 |
| 5,253,040 * | 10/1993 | Kamon et al. | 356/399 |
| 5,264,898 * | 11/1993 | Kamon et al. | 355/67 |
| 5,286,963 * | 2/1994 | Torigoe | 250/201.2 |
| 5,287,142 * | 2/1994 | Kamon | 355/53 |
| 5,296,892 * | 3/1994 | Mori | 355/67 |

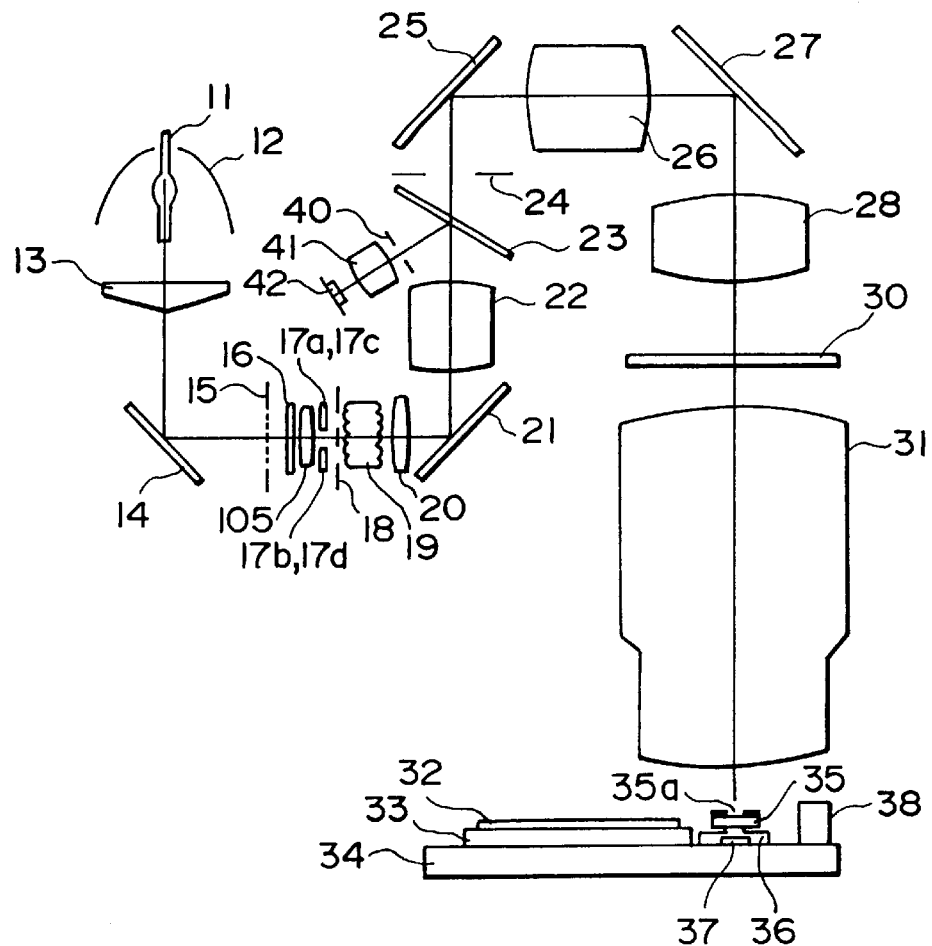
F I G. 6A
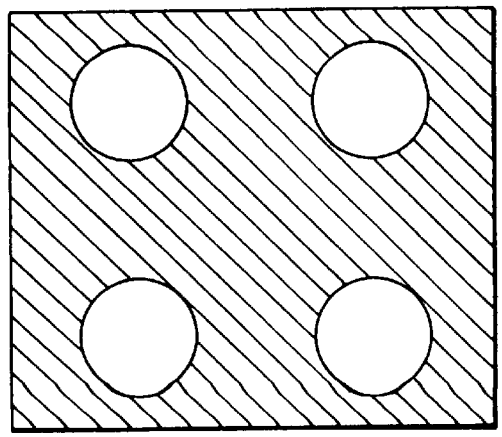
F I G. 6B

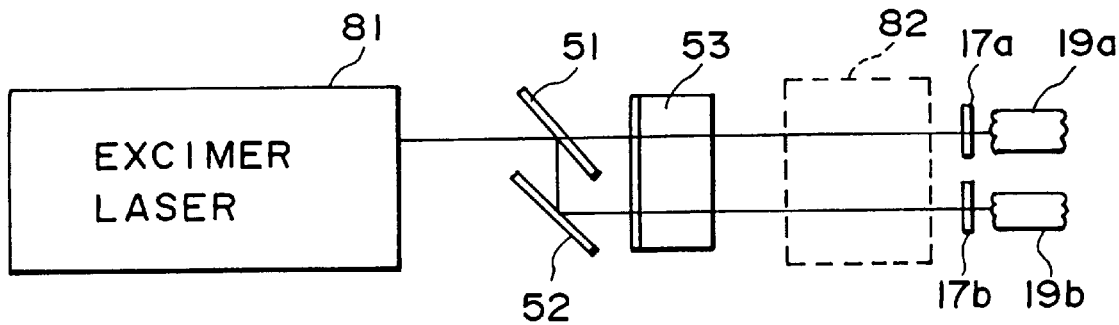
F I G. 9
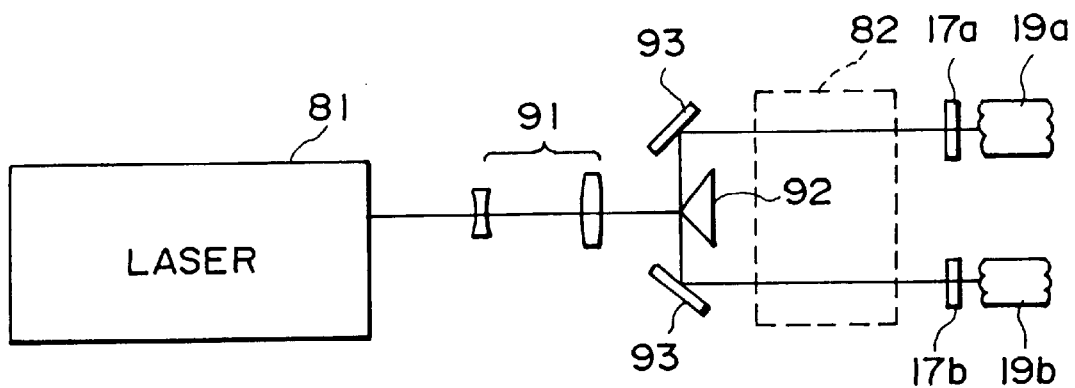
F I G. 10

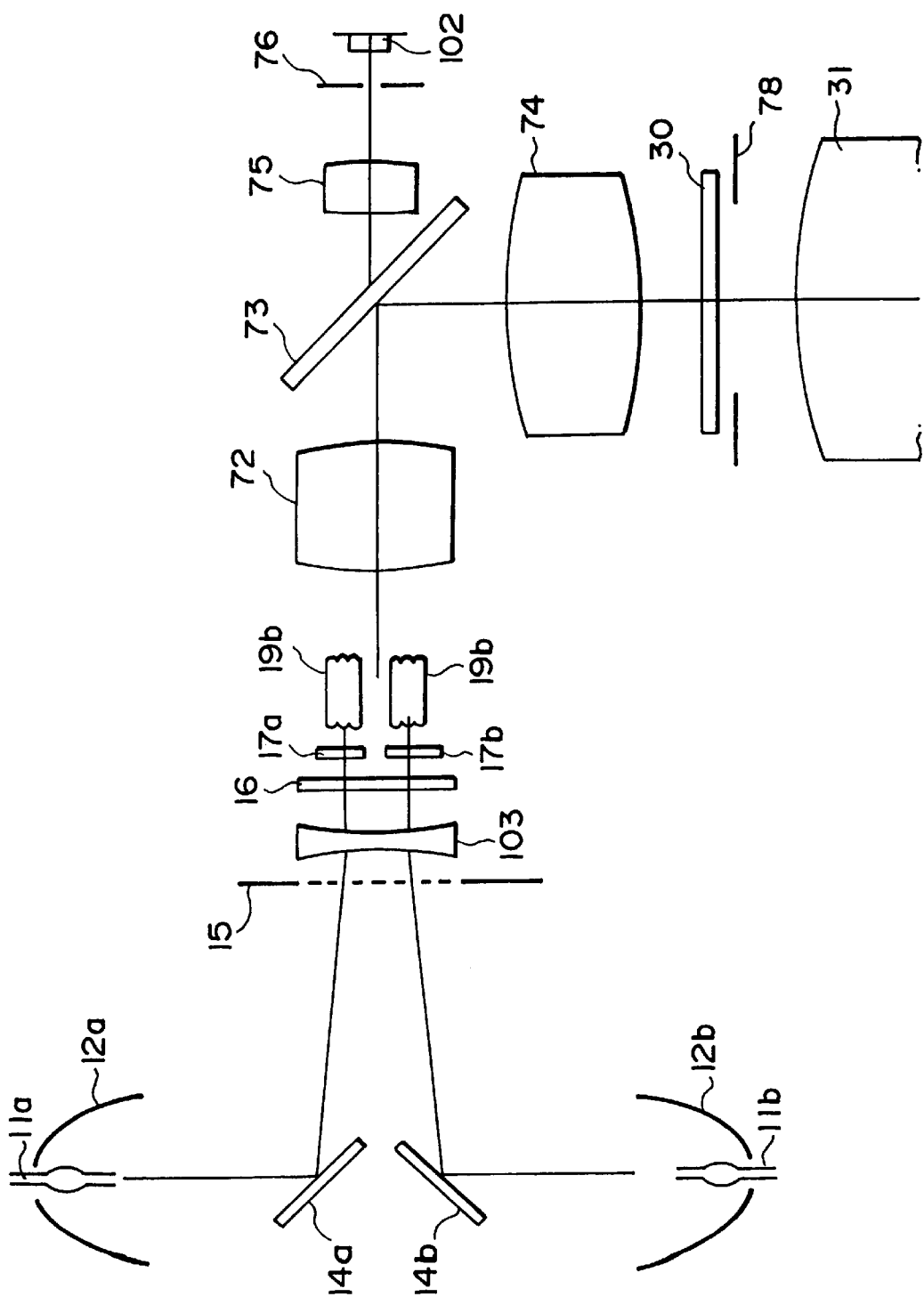
F I G. 12

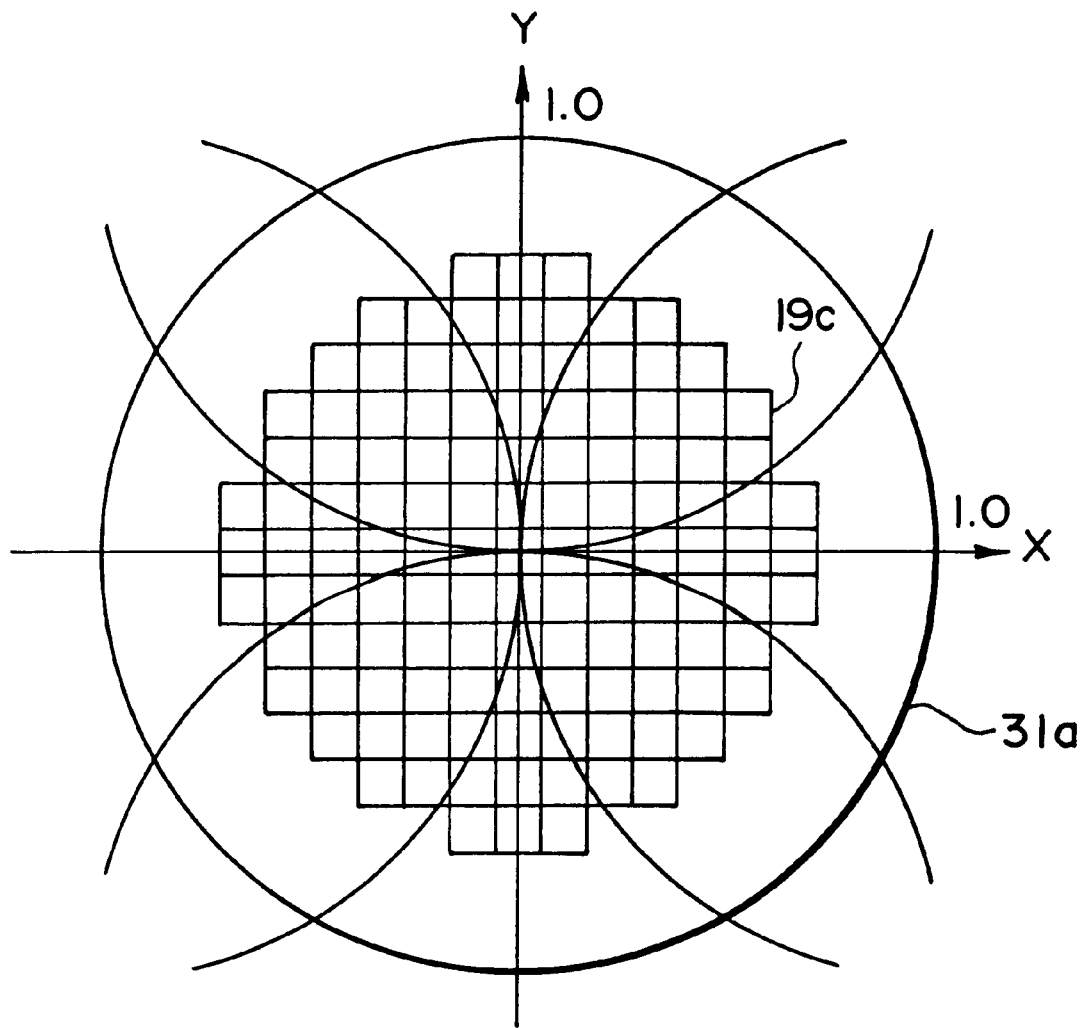
F I G. 14

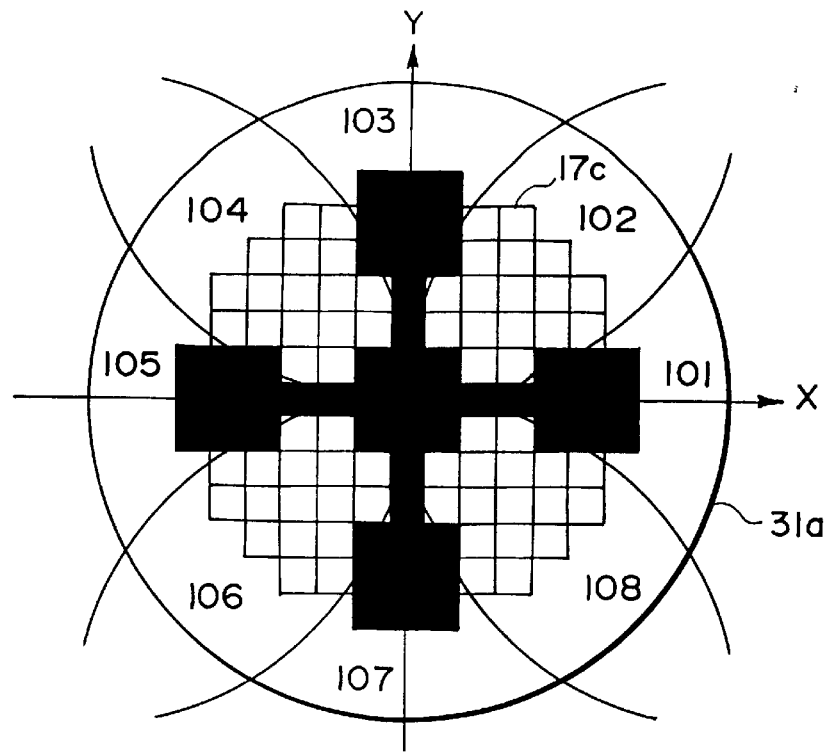
F I G. 15A
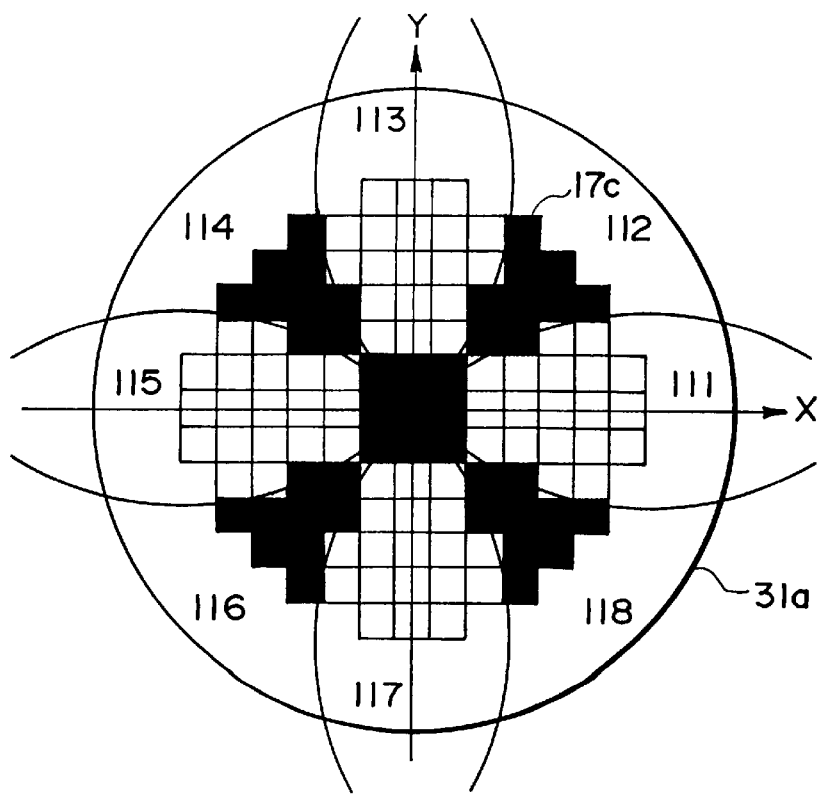
F I G. 15B

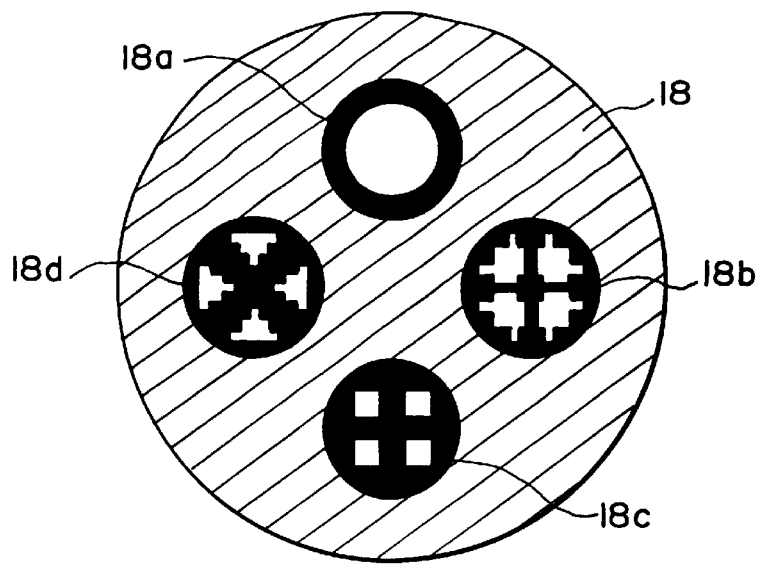
F I G. 16
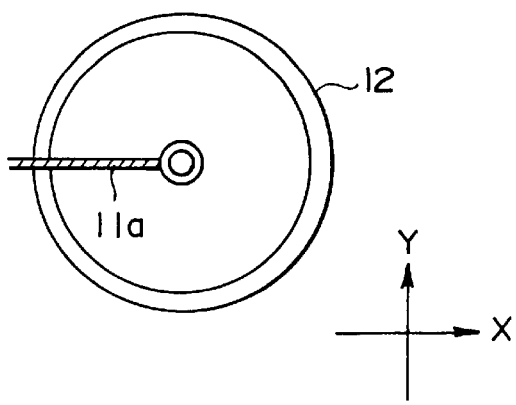 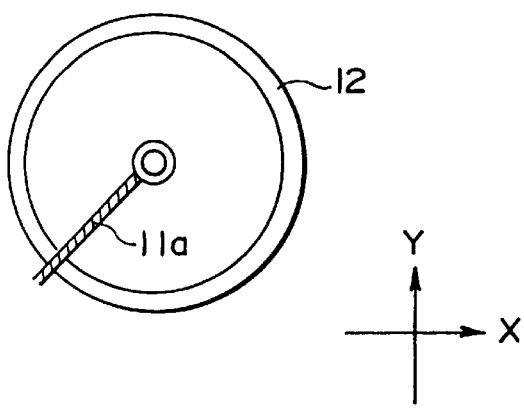
F I G. 17A    F I G. 17B
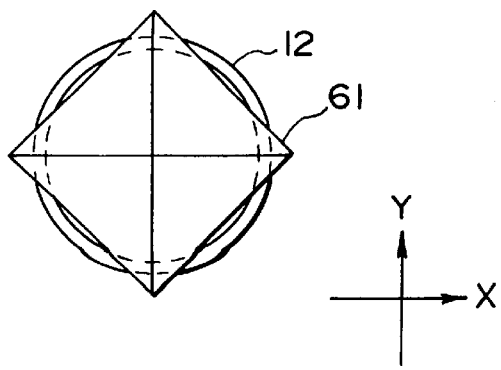 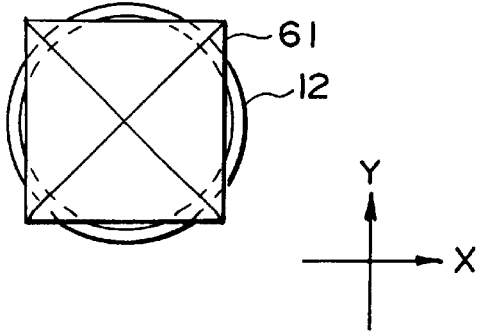
F I G. 19A    F I G. 19B

EXPOSURE APPARATUS AND DEVICE MANUFACTURING METHOD INCLUDING CHANGING A PHOTO-INTENSITY DISTRIBUTION OF A LIGHT SOURCE AND ADJUSTING AN ILLUMINANCE DISTRIBUTION ON A SUBSTRATE IN ACCORDANCE WITH THE CHANGE

This application is a continuation of prior application, Ser. No. 08/357,786 filed Dec. 16, 1994, which application is a continuation of prior application, Ser. No. 08/270,414 filed Jul. 5, 1994, which application is a continuation of prior application, Ser. No. 08/159,954 filed Dec. 1, 1993, which application is a continuation of prior application, Ser. No. 08/065,498 filed May 24, 1993, all now abandoned, which application is a divisional of prior application, Ser. No. 07/836,509, filed Feb. 18, 1992, now U.S. Pat. No. 5,305,054.

FIELD OF THE INVENTION AND RELATED ART

This invention relates generally to an imaging method for manufacture of microdevices. More particularly, in one aspect the invention is concerned with an imaging method or an illumination method therefor, suitably usable in forming on a workpiece a fine pattern of a linewidth of 0.5 micron or less.

The increase in the degree of integration of a semiconductor device has been accelerated more and more and, along such a trend, the fine processing techniques have been improved considerably. Particularly, the optical processing technique which is a major one of them has been advanced to a level of submicron region, with the start of a 1 mega DRAM. A representative optical processing machine is a reduction projection exposure apparatus, called a "stepper". It is not too much to say that enhancement of resolution of this apparatus determines the future of the semiconductor device.

Conventionally, the enhancement of resolution of the stepper mainly relies on enlarging the N.A. (numerical aperture) of an optical system (reduction projection lens system). Since however the depth of focus of an optical system is in inverse proportion to the square of the N.A., the enlargement of the N.A. causes an inconvenience of decreased depth of focus. In consideration of this, attempts have been made recently to change the wavelength of light for exposure, from the g-line to the i-line or to excimer laser light of a wavelength not longer than 300 nm. This aims at an effect that the depth of focus and the resolution of an optical system can be improved in inverse proportion to the wavelength.

On the other hand, in a way separate from shortening the exposure wavelength, a method using a phase shift mask has been proposed as a measure for improving the resolution. According to this method, a thin film is formed in a portion of a light transmitting area of a mask, which film serves to provide a phase shift of 180 deg. with respect to the other portion. The resolution RP of a stepper can be represented by an equation $RP = k_1 \lambda N.A.$, and usually the stepper has a $k_1$ factor of a level of 0.7–0.8. With the method using such a phase shift mask, the level of the $k_1$ factor can be improved to about 0.35.

However, there remain many problems to realize such a phase shift mask method. Unsolved problems currently remaining are such as follows:

(1) A satisfactory thin film forming technique for forming a phase shift film has not yet been established.

(2) A satisfactory CAD (computer-aided designing) for design of a circuit pattern with a phase shift film has not yet developed.

(3) Depending on a pattern, a phase shift film cannot be applied thereto.

(4) With respect to the inspection and correction of a phase shift film, a satisfactory technique has not yet been established.

As stated, there remain many problems to realize a phase shift mask method.

SUMMARY OF THE INVENTION

It is an object of the present invention to provide a unique and improved imaging method suitable for manufacture of microdevices such as semiconductor microcircuit devices.

It is another object of the present invention to provide a microdevice manufacturing method which uses such an imaging method.

It is a further object of the present invention to provide an exposure apparatus for manufacture of microdevices, which uses such an imaging method.

In accordance with a first aspect of the present invention, there is provided an imaging method for imaging a fine pattern having linear features extending along orthogonal first and second directions, characterized by: providing a light source having decreased intensity portions at a center thereof and on first and second axes defined to intersect with each other at the center and defined along the first and second directions, respectively; and illuminating the pattern with light from the light source.

In accordance with a second aspect of the present invention, there is provided a method of imaging a fine pattern having linear features extending in orthogonal first and second directions, wherein the pattern is illuminated with light obliquely with respect to the pattern, the improvements residing in that: the strength of illumination in a predetermined plane of incidence is made greater than that in a first plane of incidence including the first direction and that in a second plane of incidence including the second direction and intersecting with the first plane of incidence perpendicularly.

In accordance with a third aspect of the present invention, there is provided a method of imaging a fine pattern having linear features each extending in a predetermined direction, wherein the pattern is illuminated with light obliquely with respect to the pattern, the improvements residing in that: the illumination of the pattern with light along a path in a plane of incidence including the predetermined direction is substantially blocked; and the pattern is illuminated with light along a pair of paths which are symmetrical with each other with respect to the plane of incidence.

In accordance with a fourth aspect of the present invention, there is provided an illumination method in image projection, for illuminating a fine pattern of an original, characterized by: providing a light intensity distribution having decreased intensity portions at a center thereof and on first and second orthogonal axes with respect to which the original is to be placed.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 2A and 2B are schematic views, respectively, wherein FIG. 2A shows a light distribution as provided on a pupil by diffraction light from a conventional mask and FIG. 2B shows a light distribution as provided on a pupil by diffraction light from a phase shift mask.

FIGS. 3A and 3B show a first embodiment of the present invention, wherein FIG. 3A is a schematic view of an example of an effective light source as formed on a pupil by zero-th order light in the first embodiment and FIG. 3B shows another example of an effective light source as formed on a pupil by zero-th order light in the first embodiment.

FIGS. 5A–5C show a second embodiment of the present invention, wherein FIG. 5A is a schematic view of a projection exposure apparatus according to the second embodiment of the present invention, FIG. 5B is a front view of a stop member used in the second embodiment, and FIG. 5C is a schematic view of a cross filter used in the second embodiment.

FIGS. 6A and 6B show a third embodiment of the present invention, wherein FIG. 6A is a schematic view of a projection exposure apparatus according to the third embodiment and FIG. 6B is a front view of a stop member used in the third embodiment.

FIG. 9 is a fragmentary schematic view of a projection exposure apparatus according to a sixth embodiment of the present invention.

FIG. 10 is a fragmentary schematic view of a projection exposure apparatus according to a seventh embodiment of the present invention.

FIG. 12 is a fragmentary schematic view of a projection exposure apparatus according to a ninth embodiment of the present invention.

FIG. 14 is a schematic view for explaining the relationship between a pupil of a projection optical system and an optical integrator.

FIGS. 15A and 15B are schematic views, respectively, each showing the pupil of the projection optical system.

FIG. 16 is a schematic view of a stop member usable in the present invention.

FIGS. 17A and 17B are schematic views, respectively, each showing the manner of cabling a mercury lamp.

FIGS. 19A and 19B are schematic views, respectively, for explaining the manner of insertion of a pyramid type prism used in another embodiment of the present invention.

DESCRIPTION OF THE PREFERRED EMBODIMENTS

For better understanding of the present invention, description will be made first on details of the imaging of a fine pattern.

Figure 1:
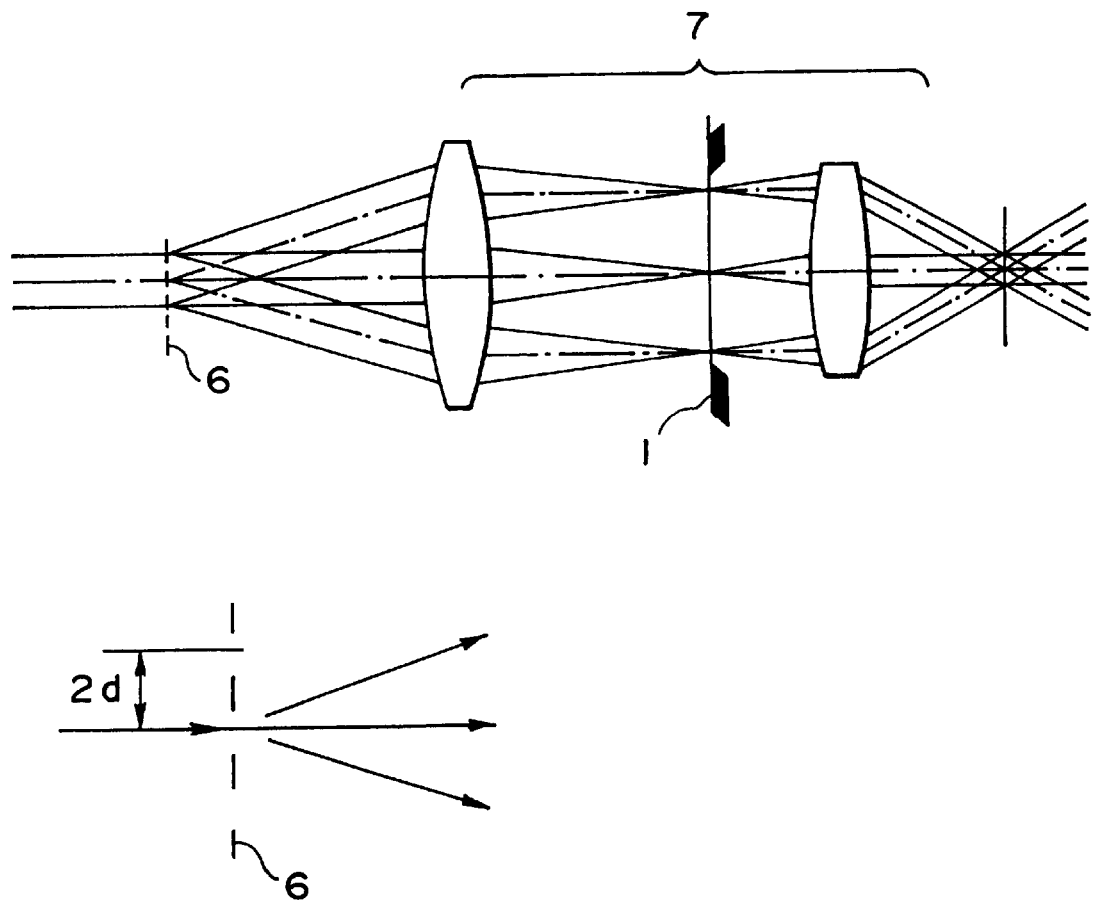
FIG. 1 is a schematic view for explaining the principle of projection of an image of a fine pattern.

FIG. 1 shows the principle of image projection of a fine pattern 6 having a high frequency (pitch 2d is about several microns), through a projection lens system 7. The fine pattern 6, which is illuminated along a direction perpendicular to the surface thereof, diffracts the light inputted thereto. Diffraction lights caused thereby include a zero-th order diffraction light, directed in the same direction as the direction of advancement of the input light, and higher order diffraction lights such as positive and negative first order diffraction lights, for example, directed in directions different from the input light. Among these diffraction lights, those of particular diffraction orders such as, for example, the zero-th order diffraction light and positive and negative first order diffraction lights are incident on a pupil 1 of the projection lens system 7. Then, after passing through the pupil 1, these lights are directed to an image plane of the projection lens system, whereby an image of the fine pattern 6 is formed on the image plane. In this type of image formation, the light components which are contributable to the contrast of the image are higher order diffraction lights. If the frequency of a fine pattern increases, it raises a problem that an optical system does not receive higher order diffraction lights. Therefore, the contrast of the image degrades and, ultimately, the imaging itself becomes unattainable.

Figure 2B:
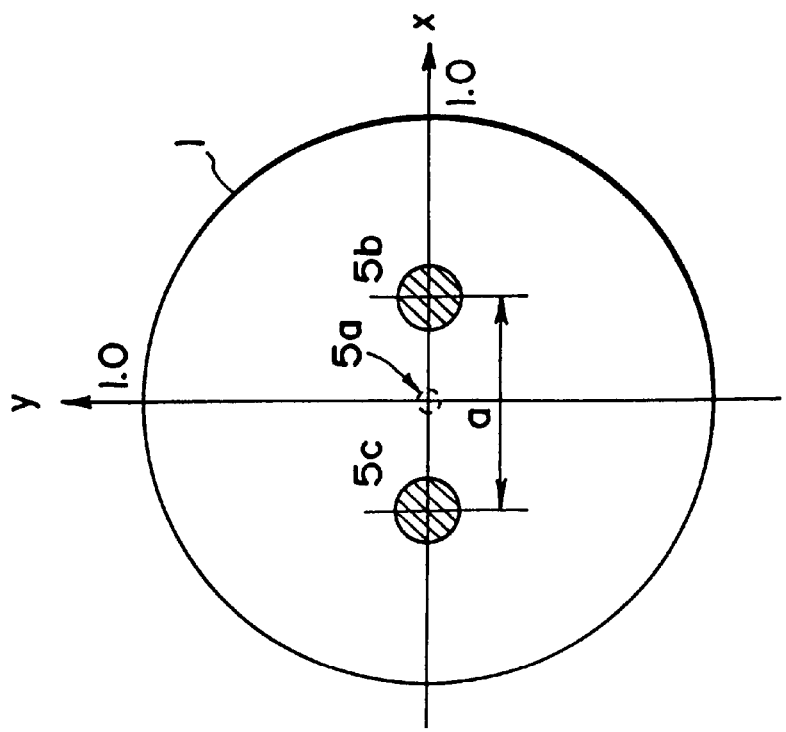
Figure 2A:
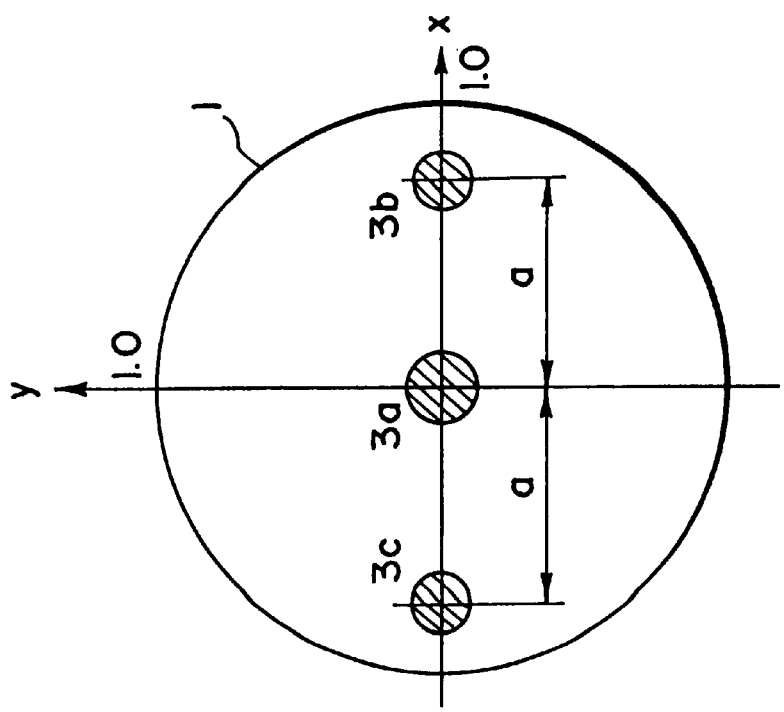

FIG. 2A shows a light distribution on the pupil 1 or in an occasion when the fine pattern 6 of FIG. 1 is formed on a mask of conventional type, while FIG. 2B shows a light distribution on the pupil 1 on an occasion where the fine pattern 6 is formed on a phase shift mask.

In FIG. 2A, about a zero-th order diffraction light 3a, there are a positive first order diffraction light 3b and negative first order diffraction light 3c. In FIG. 2B, on the other hand, due to the affect of a phase shift film a zero-th order diffraction light 5a is "extinguished" and there are positive and negative first order diffraction lights 5b and 5c only. Comparing the cases of FIGS. 2A and 2B, the following two points may be raised as advantageous effects of a phase shift mask upon the plane of spatial frequency, i.e., the pupil plane:

(1) In the phase shift mask, the frequency is decreased to a half.

(2) In the phase shift mask, no zero-th order diffraction light exists.

Another point to be noted here may be that the spacing a between the positive and negative first order diffraction lights upon the pupil plane in the case of the phase shift mask corresponds to the spacing a between the zero-th order light and the positive (negative) first order diffraction light in the case of the conventional type mask.

On the other hand, as regards the light distribution on the pupil 1, the conventional type mask and the phase shift type mask show the same characteristic with respect to the position. What is the difference therebetween is the ratio of intensity of the amplitude distribution upon the pupil 1. In the phase shift mask shown in FIG. 2B, the amplitude ratio among the zero-th order, positive first order and negative first order diffraction lights is 0:1:1, whereas in the conventional type mask shown in FIG. 2A it is $1:2/\pi:2/\pi$.

In accordance with one aspect of the present invention, a light distribution similar to that to be produced by a phase shift type mask can be produced on the pupil 1. More specifically, according to this aspect of the present invention, in order to assure that, when a fine pattern 6 (more particularly, a fine pattern as having a spatial frequency that the $k_1$ factor is about 0.5, as suggested in the introductory part of the Specification) is illuminated, a zero-th order diffraction light is incident on the pupil 1 at a position off the center of the pupil 1 while a different diffraction light of higher order is similarly incident on a position off the center of the pupil 1, an optical arrangement is provided to produce such an effective light source that: it has a light quantity distribution in which, as compared with the light intensity in each of portions on a pair of axes passing through the center of the pupil and extending along longitudinal and lateral pattern features of the fine pattern and as compared with the light intensity in a portion around the center of the pupil, the light intensity in a portion other than these portions is higher. Preferably, there may be produced an effective light source in which the light intensity at each of the portions on the pair of axes passing through the center of the pupil and extending along the longitudinal and lateral pattern features of the fine pattern as well as the light intensity in the portion around the center of the pupil, are lowered to about zero.

When such an effective light source is provided, of zero-th order and first order diffraction lights, for example (as produced as a result of illumination of a fine pattern of a $k_1$ factor of about 0.5, for example). the zero-th order diffraction light and one of the positive and negative first order diffraction lights may be projected on the pupil 1 whereas the other of the positive and negative first order diffraction lights may be prevented from being projected onto the pupil 1. This assures a light distribution similar to that to be provided by a phase shift mask, on the pupil 1.

If in the present invention a single light beam is used for the illumination, the amplitude ratio of a pair of diffraction lights at the pupil 1 becomes $1:2/\pi$, different from a desirable amplitude ratio of 1:1 similar to that as attainable with a phase shift mask. However, according to the analyses made by the inventors of the subject application, it has been found that: for resolving a longitudinal pattern feature of a mask, such a difference in amplitude ratio can be substantially compensated by using, as the light to be obliquely projected on the mask (fine pattern), a pair of lights from a pair of light sources disposed symmetrically with each other with respect to a longitudinal axis of the pupil (an axis passing through the center of the pupil and extending along the longitudinal pattern feature) so as to produce on the pupil a pair of light patterns which are symmetrical with each other with respect to the longitudinal axis of the pupil; and that for resolving a lateral pattern feature of the mask, the difference in amplitude ratio can be compensated by using, as the light to be projected obliquely on the mask (fine pattern), a pair of lights from a pair of light sources disposed symmetrically with each other with respect to a lateral axis of the pupil (an axis passing through the center of the pupil, extending along the lateral pattern feature and being perpendicular to the longitudinal axis of the pupil) so as to produce a pair of light patterns which are symmetrical with each other with respect to the lateral axis of the pupil.

For resolving a mask pattern having longitudinal and lateral pattern features, two illumination light beams, for example, may be used and projected obliquely to the mask so as to produce an effective light source having, on the pupil, a light quantity distribution with a pair of peaks of substantially the same intensity at those positions: which are symmetrical with each other with respect to the center of the pupil, and which are located along a first axis passing through the center of the pupil and extending with an angle of about 45 deg. with respect to the X and Y axes. Also, four illumination light beams, for example, may be used and projected obliquely to the mask so as to produce an effective light source having, on the pupil, a light quantity distribution with (i) a pair of portions of substantially the same intensity at those positions: which are symmetrical with each other with respect to the center of the pupil, and which are located along a first axis passing through the center of the pupil and extending with an angle of about 45 deg. with respect to the X and Y axes and (ii) with a pair of portions of substantially the same intensity at those positions: which are symmetrical with each other with respect to the center of the pupil, which are located along a second axis passing through the center of the pupil and extending with an angle of about 90 deg. with respect to the first axis, and which are at substantially corresponding locations with respect to the pair of positions on the first axis and the center of the pupil.

Figure 3B:
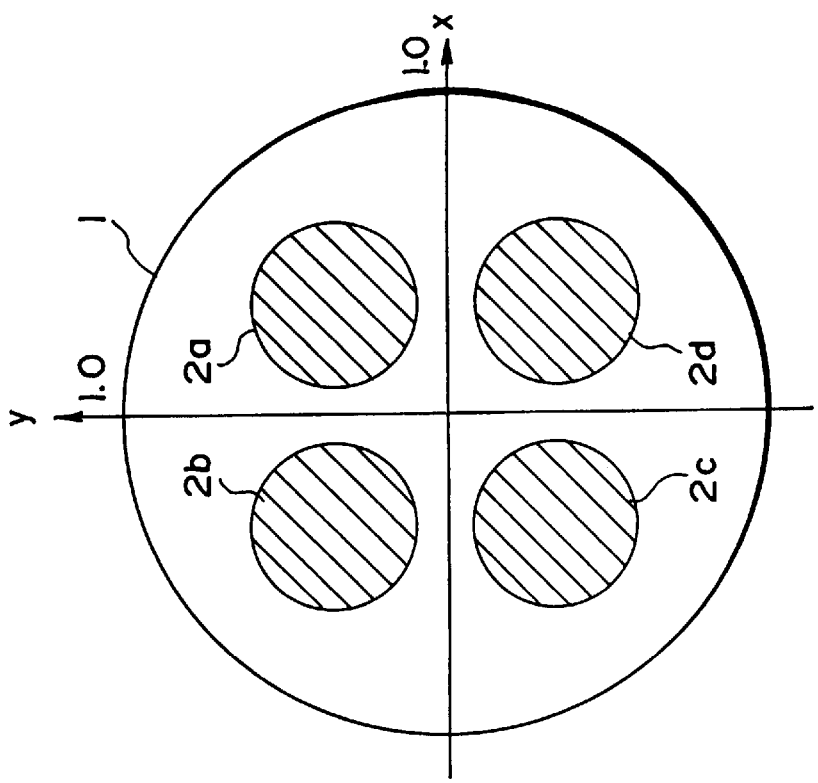
Figure 3A:
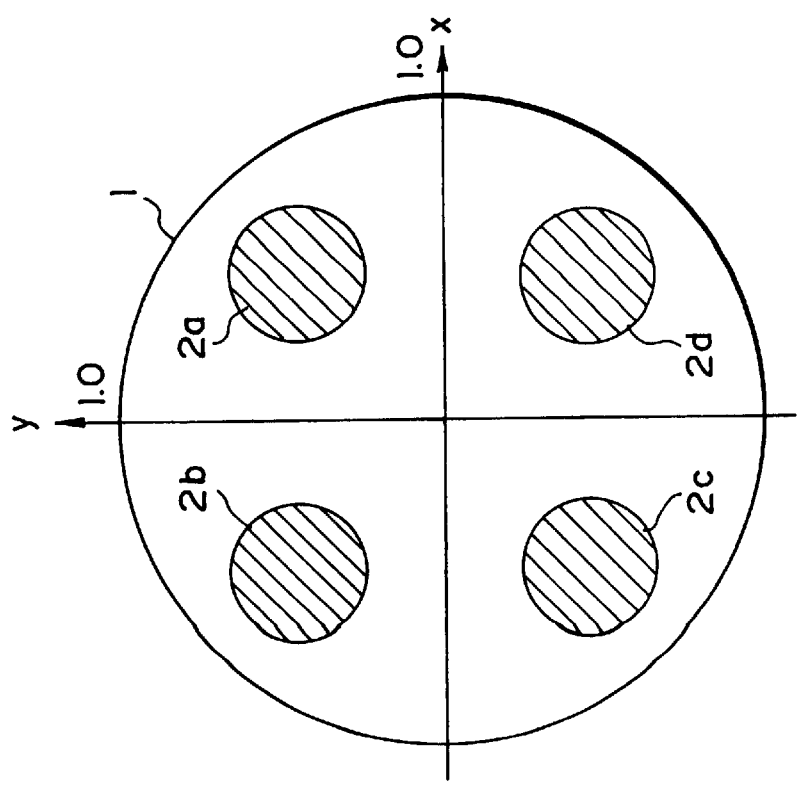

A first embodiment of the present invention will be explained with reference to FIGS. 3A and 3B, wherein FIG. 3A shows a light distribution of zero-th order diffraction light on the pupil 1 of FIG. 1, while FIG. 3B shows a distribution of an effective light source on a pupil plane.

In the drawings, denoted at 1 is a pupil; denoted at x is a lateral axis of the pupil (an axis passing through the center of the pupil and extending along a lateral pattern feature); denoted at y is a longitudinal axis of the pupil (an axis passing through the center of the pupil, extending along a longitudinal pattern feature and being perpendicular to the x axis); and denoted at 2a, 2b, 2c and 2d are portions of an effective light source.

In these two examples, the effective light source has a distribution generally consisting of four portions. Each portion (light pattern) has a distribution of circular shape. If the radius of the pupil 1 is 1.0, the pupil center is at the origin of the coordinate and the x and y axes are the orthogonal coordinate axes, then in the FIG. 3A example the centers of the portions 2a, 2b, 2c and 2d are at the positions (0.45, 0.45), (−0.45, 0.45), (−0.45, −0.45) and (0.45, −0.45), and the radius of each portion is 0.2. In the FIG. 3B example, the centers of the portions 2a, 2b, 2c and 2d are at the positions (0.34, 0.34), (−0.34, 0.34), (−0.34, −0.34) and (0.34, −0.34). and the radius of each portion is 0.25.

The effective light source according to this embodiment is characterized in that: when the pupil plane is divided into four quadrants by the x and y axes defined on the pupil plane, as stated above, each portion 2a, 2b, 2c or 2d is defined in corresponding one of the quadrants and also these portions are defined in a symmetrical relationship and defined independently of each other, without overlapping. Here, the x and y axes for the division of the quadrants correspond to the x and y axes, for example, used for the design of an integrated circuit pattern and they correspond to the directions of elongation of longitudinal and lateral pattern features of a mask.

The shape of the effective light source according to this embodiment is determined in specific consideration of the directivity of longitudinal and lateral pattern features of a fine pattern whose image is to be projected, and it is characterized in that: the centers of the four circular portions 2a–2d are just on ±45 deg. directions (the directions along a pair of axes passing through the center of the pupil 1 and extending with angles of ±45 deg. with respect to the X and y axes). In order to produce such an effective light source, a light source (secondary light source) having the same shape and the same relationship, with respect to the x and y axes, as that illustrated may be provided on a plane optically conjugate with the pupil 1 and four illumination light beams from the provided light source may be projected obliquely to a fine pattern at the same angle of incidence and along two orthogonal planes of incidence (each two light beams in a pair). This assures that: linear pattern features extending along the x axis are illuminated obliquely by the light beams projected along the paths which are symmetrical with each other with respect to the plane of incidence including the x axis; while linear pattern features extending along the y axis are illuminated obliquely by the light beams projected along the paths which are symmetrical with each other with respect to the plane of incidence including the y axis.

It is important that the four portions 2a–2d of the effective light source have substantially the same intensity. If the intensity ratio changes, any defocus of a wafer during the printing thereof, for example, causes deformation of the image of a circuit pattern. For this reason, preferably the four illumination light beams are so set as to provide the same intensity. As regards the intensity distribution of each of the four portions 2a–2d, it may be determined as desired. For example, it may be a uniform intensity distribution wherein the whole range is at a peak level, or it may be a non-uniform intensity distribution wherein the peak is only at the center. This means that the four illumination light beams may take various forms in accordance with the form of an effective light source to be provided on the pupil 1. As an example, while in this embodiment the four portions of the effective light source are separated from each other and thus no light pattern is produced in a portion other than the four portions, the four portions of the effective light source may be formed to be continuous with the intervention of lower intensity light patterns.

The distribution (shape) of each of the four portions 2a–2d of the effective light source is not limited to a circular shape. However, it is desirable that, independently of the shape, the centers of the four portions or the gravity centers of their intensity distributions are in a symmetrical relationship and are on the ±45 deg. directions with respect to the x and y axes, as in the examples of FIGS. 3A and 3B.

For further enhancement of resolution, i.e., in an attempt to adopt an arrangement of an optimum effective light source adapted to provide a system of lower $k_1$ level, it is seen from the comparison of FIG. 3A with FIG. 3B that the gravity center position of each portion 2a, 2b, 2c or 2d of the effective light source in each quadrant displaces away from the center of the pupil 1 and, as a result, the diameter of each independent portion 2a, 2b, 2c or 2d in a corresponding quadrant decreases.

Illustrated in FIGS. 3A and 3B are two types of effective light sources expected. In practical design, an effective light source similar to these two types may be used, since, if the gravity center position of each portion of the effective light source is too far from the center of the pupil 1, a problem of a decrease of light quantity, for example, may result (in the respect of convenience in design of the optical system).

According to the investigations on that point made by the inventors, it has been found that: in the coordinate and the pupil 1 shown in FIGS. 3A and 3B, if each of a pair of portions 2a and 2c which are in the first and third quadrants, respectively, and which are spaced from each other has a circular shape and a radius q and if the center positions (gravity center positions) of the first and second portions 2a and 2c are at coordinates (p, p) and (–p, –p), respectively, then good results are obtainable by satisfying the following conditions:

$$0.25 < p < 0.6$$

$$0.15 < q < 0.3$$

It is to be noted that the size and position of each of the remaining portions 2b and 2d in the second and fourth quadrants are determined naturally from the symmetry of them to the portions 2a and 2c in the first and third quadrants. Also, it has been found that, even In a case when each portion of the effective light source has a shape other than a circular shape, such as, for example, triangular or rectangular, preferably the above conditions should be satisfied. In such a case the radius of a circle circumscribing each portion may be used as the value of q. In the examples show in FIGS. 3A and 3B, each quantity is near the middle of the range defined by the corresponding condition. The quantities of p and q may change depending upon a desired linewidth of a fine pattern which is required to be projected by the optical system (illumination system/projection system) used.

In a currently used stepper, an effective light source has a peak at a center (x, y)=(0, 0) of a pupil 1. In this type of apparatus, it is said that the coherence factor (σ level) is 0.3 or 0.5, and this means that it has an effective light source distribution having a radius of 0.3 or 0.5 about the center of the pupil 1. According to the analyses made by the inventors, it has been found that: if an effective light source is positioned close to the pupil center, for example, If the σ level is in a range not greater than 0.1, it provides an advantage that when defocus occurs a high contrast can be retained mainly with regard to a relatively wide linewidth (a linewidth to which the above-described $k_1$ factor is not less than 1). However, such an advantage as obtainable when defocus occurs diminishes quickly as the $k_1$ factor becomes close to 0.5. If the $k_1$ factor goes beyond 0.5, in a strict case the contrast of an image is lost fully. What is most required currently is the improvement in defocus performance at a $k_1$ factor level not greater than 0.6 and, in cases where the $k_1$ factor is at about this level, the presence of an effective light source adjacent to the pupil center has an adverse effect on the imaging.

As compared therewith, the effective light source having been described with reference to the first embodiment has a small $k_1$ factor. For the imaging with respect to a $k_1$ factor of about 0.5, it provides an advantageous effect of retaining a high contrast when defocus occurs. Since in the example of FIG. 3A each of the portions 2a–2d of the effective light source is located outwardly, as compared with those of the FIG. 3B example, it provides a superior high frequency characteristic as compared with the FIG. 3B example. It is to be noted that, in a portion of the effective light source spaced away from the pupil center, the defocus characteristic is such that, up to a $k_1$ factor of about 1, the depth of focus is maintained substantially at a constant level.

Figure 4:
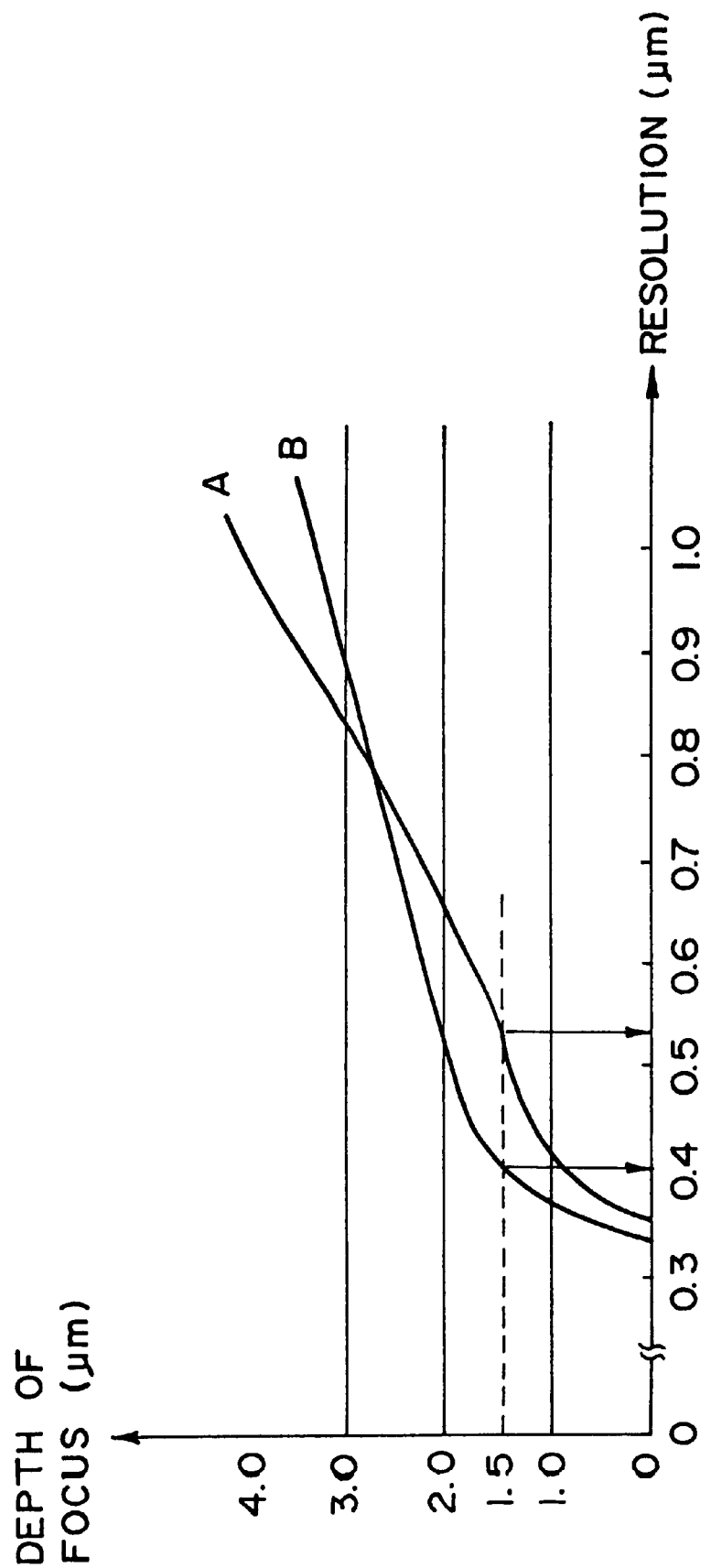
FIG. 4 is a graph for explaining frequency characteristics of a projection system which forms the effective light source of the FIG. 3A example and that of a projection system of conventional type.

FIG. 4 shows the relationship between the resolution and the depth of focus in a case when the example of FIG. 3B is applied to an i-line stepper having a N.A. of 0.5. the calculations having been made on an assumption that the defocus in a range satisfying the contrast of an optical image of 70% is within the depth of focus (tolerance). Curve A in the drawing depicts the relationship between the resolution and the depth of focus in the case of the conventional method (σ=0.5) using a conventional reticle, while curve B depicts the relationship between the resolution and the depth of focus in the case of the FIG. 3B example. If the limit of the depth of focus of a stepper which may be practically admitted is set to be equal to 1.5 micron, then the limit of resolution is 0.52 micron in the case of the conventional method. As compared, in the case of the FIG. 3B example, the resolution is improved to about 0.4 micron. This corresponds to an improvement of about 30% in terms of ratio, which is considerably large in the field to which the present invention pertains. In effect, a resolution of about 0.45 ($k_1$ factor) is easily attainable.

The present invention in this aspect differs from what can be called a "ring illumination method" wherein no effective light source is formed at the pupil center in that: on the pupil 1, the effective light source has a peak neither on the x axis nor on the y axis corresponding to the direction of the longitudinal pattern feature or the lateral pattern feature of the fine pattern. This is for the reason that, if the effective light source has a peak on the x axis or the y axis, the contrast of an image degrades largely and thus a large depth of focus is not obtainable. It has been confirmed that, with respect to the image projection of a fine pattern mainly consisting of longitudinal and lateral pattern features, the present invention assures formation of an image of improved image quality as compared with that obtainable by the ring illumination method.

The light quantity (light intensity) in each principal portion of the effective light source of the present invention may be either uniform or non-uniform such as a Gaussian distribution.

Figure 5A:
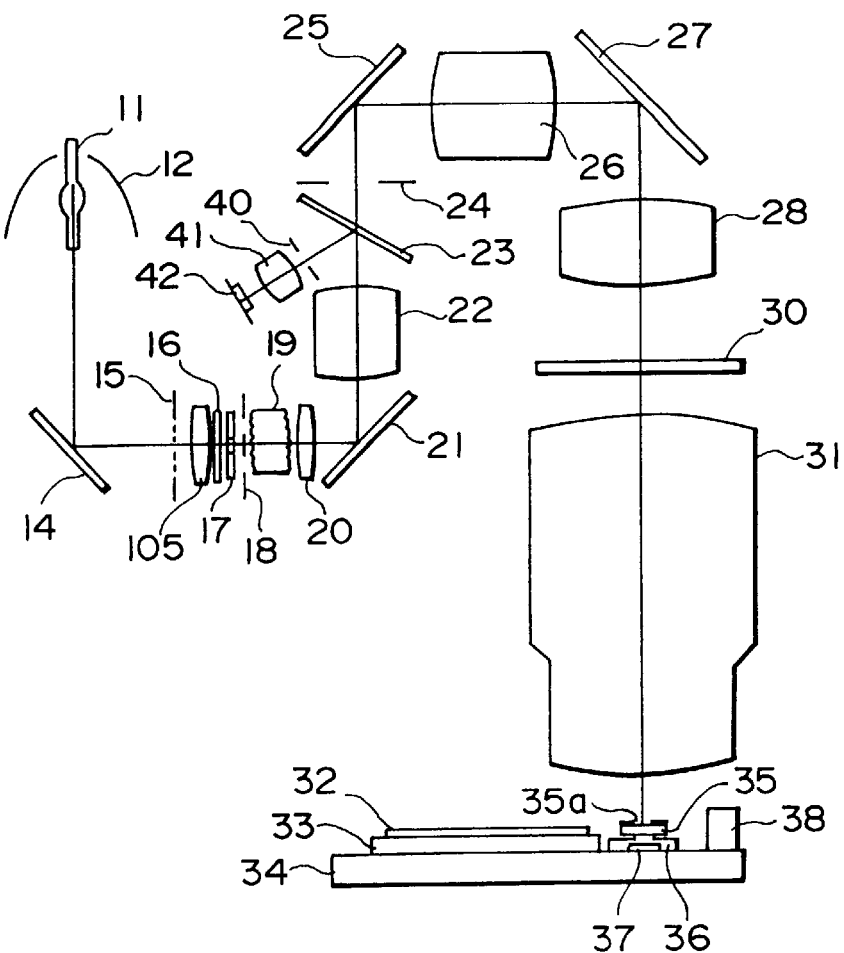
Figure 5B:
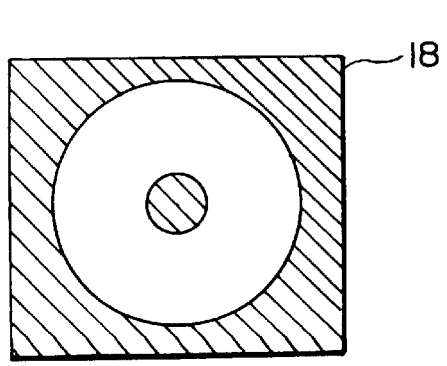
Figure 5C:
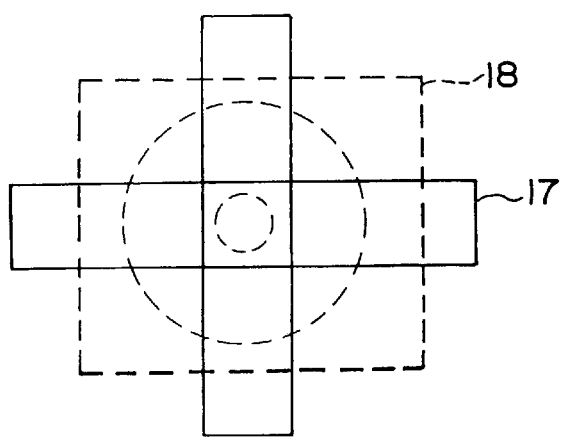

FIGS. 5A, 5B and 5C show a second embodiment of the present invention and illustrate a semiconductor device manufacturing exposure apparatus arranged to project an image of a fine pattern in accordance with an aspect of the invention.

Denoted in the drawings at 11 is an ultra-high pressure Hg lamp having its light emitting portion disposed at a first focal point of an elliptical mirror 12; denoted at 14, 21, 25 and 27 are deflecting mirrors: and denoted at 15 is an exposure control shutter. Denoted at 105 is a field lens; denoted at 16 is a wavelength selecting interference filter; denoted at 17 is a cross ND (neutral density) filter; denoted at 18 is a stop member having a predetermined aperture; denoted at 19 is an optical integrator having its light receiving surface disposed at a second focal point of the elliptical mirror 12; and denoted at 20 and 22 are lenses of a first imaging lens system (20, 22). Denoted at 23 is a half mirror; denoted at 24 is a masking blade device having a rectangular aperture for defining a region of illumination on a reticle; denoted at 26 and 28 are lenses of a second imaging lens system (26, 28); and denoted at 30 is a reticle having formed thereon an integrated circuit pattern mainly consisting of longitudinal and lateral pattern features (grid-like linear features) of a minimum linewidth of about 2 microns. Denoted at 31 is a reduction projection lens system for projecting the circuit pattern of the reticle 30 in a reduced scale of 1:5; denoted at 32 is a wafer coated with a resist; denoted at 33 is a wafer chuck for holding the wafer 32 by attraction; and denoted at 34 is an X–Y stage for supporting the wafer chuck 33 and being movable in x and y directions of an X–Y coordinate system defined in the exposure apparatus in relation to the X–Y stage. Denoted at 35 is a glass plate having formed thereon a light blocking film with an aperture 35a at its center; denoted at 36 is a casing having an aperture formed in its top surface; denoted at 37 is a photoelectric converter provided in the casing 36; and denoted at 38 is a mirror which is a component of a laser interferometer (not shown) for measuring the amount of movement (x axis) of the wafer stage 34. Denoted at 40 is a light blocking plate having a predetermined aperture, which is disposed at a position optically equivalent to the light receiving surface of the blade 24 so that, like the blade 24, the light beams emanating from the lenses of the optical integrator 19 are overlapped one upon another on the plate 40. Denoted at 41 is a condensing lens for collecting light passed through the aperture of the light blocking plate 40; and denoted at 42 is a quartered detector.

As is well known in the art, usually a circuit pattern of a reticle (mask) is designed with reference to orthogonal axes (coordinates) so that longitudinal pattern features and lateral pattern features of the pattern extend along these axes, respectively. When such a reticle is introduced into a projection exposure apparatus, the reticle is placed on a reticle stage with reference to x and y axes of an X–Y coordinate system defined in the exposure apparatus, with the orthogonal design axes of the reticle placed exactly or substantially aligned with the x and y axes of the exposure apparatus. Also, the the X–Y stage on which a wafer is placed has an X–Y coordinate system with x and y axes along which the X–Y stage is movable. These x and y axes of the X–Y stage are designed to be exactly or substantially correspond to the x and y axes of the exposure apparatus. Thus, when a reticle is placed in the exposure apparatus, usually the directions of longitudinal and lateral pattern features of the reticle are placed in exactly or substantially exactly alignment with the x and y axes defined in the exposure apparatus, respectively, or with the x and y axes along which the X–Y stage moves.

A structural feature of this apparatus resides in the filter 17 and the stop member 18 disposed in front of the integrator 19. As shown in FIG. 5B, the stop member 18 comprises an aperture stop with a ring-like aperture, for blocking the light near the optical axis of the apparatus, and it serves to define the size and shape of an effective light source on the pupil plane of the projection lens system 31. The center of the aperture is aligned with the optical axis of the apparatus. On the other hand, as shown in FIG. 5C, the filter 17 comprises four ND filters which are disposed, as a whole, in a cross-like shape. These four ND filters serve to attenuate the intensity of light, projected to four zones in the ring-like aperture of the stop member 18, by 10–100%. These four zones correspond respectively to the portions on the pupil plane of the projection lens system 31, which portions include four points on the x and y axes corresponding respectively to the directions of the longitudinal and lateral pattern features of the reticle 30. By means of this filter 17, the light intensity at the central portion of a secondary light source as formed at the light emitting surface of the integrator 19 as well as the light intensity along the x and y axes, intersecting with each other at the center of the secondary light source, are attenuated and, as a result, the light intensity of the effective light source along the x and y axes on the pupil plane of the projection lens system 31 is attenuated.

The reticle 30 is held on a reticle stage, not shown. The projection lens system 31 may be designed with respect to light of i-line (wavelength 365 nm) as selected by the filter 16. The first and second imaging lens systems (20, 22; 26, 28) are so set as to place the light emitting surface of the integrator 19 and the pupil plane of the projection lens system 31 in an optically conjugate relationship, while the second imaging lens system (26, 28) is so set as to place the edge of the aperture of the blade device 24 and the circuit pattern of the reticle 30 in an optically conjugate relationship. The blade device 24 comprises four light blocking plates each having a knife-edge like end and each being movable independently of the others so as to allow adjustment of the size of the aperture in accordance with the size of the integrated circuit pattern on the reticle 30. The position of each light blocking plate is controlled in response to a signal from a computer (not shown) provided for the overall control of the apparatus, and the size of the aperture is optimized to the reticle 30 used. While not shown in the drawings, the exposure apparatus is equipped with a reticle alignment scope to be used for aligning the reticle 30 with respect to the exposure apparatus as well as an off-axis alignment scope disposed beside the projection lens system 31, for aligning the wafer 32 with respect to the reticle 30.

The half mirror 23 serves to reflect a portion of light from the integrator 19, and the reflected light is projected through the aperture of the light blocking plate 40 and is collected by the condensing lens 41 upon the quartered detector 42. The detector 42 has a light receiving surface disposed to be optically equivalent to the pupil plans of the projection lens system 31, and a ring-like effective light source as formed by the stop member 18 is projected on this light receiving surface. Each detector section of the detector 42 produces a signal corresponding to the intensity of light impinging on the surface of that section. By integrating the output signals of the sections of the detector 42, an integration signal for the opening/closing control of the shutter 15 is obtainable.

The components 35–37 disposed on the X–Y stage 34 provide a measuring unit for examination of the performance of the illumination system above the reticle 30. For the examination of the illumination system, the X–Y stage 34 moves to a predetermined position to place the measuring unit at a position just below the projection lens system 31. In this measuring unit, light emanating from the illumination system and reaching the image plane of the projection lens system 31 is directed through the aperture 35a of the glass plate 35 and the aperture of the casing 36 to the photoelectric converter 37. The light receiving plane of the aperture 35a is placed at the image plane position of the projection lens system 31 and, if necessary, by using an unshown focus detecting system (a sensor of well known type, for detecting the level of the wafer 32 surface) as well as a measuring unit provided in the X–Y stage 34, the level of the aperture 35a in the direction of the optical axis of the apparatus may be adjusted. The glass plate 35 is attached to the casing 36, and the casing 36 has formed therein an aperture as described. In this example, the measuring unit is so arranged that the aperture of the casing 36 is displaceable to the aperture of the glass plate by a predetermined amount. The aperture of the casing 36 is placed at such a location at which the N.A. at the image plane side of the projection lens system 31 is large and also which is spaced sufficiently from the image plane. As a result, at the light receiving plane of the aperture of the casing 36, the same light distribution as provided on the pupil plane of the projection lens system 31 is produced. In this embodiment, such a measuring unit is not used. How the measuring unit is to be used will be described later with reference to an embodiment to be described hereinafter.

In this embodiment: through the function of the filter 17 and the stop member 18, an effective light source having a generally ring-like shape but having decreased intensity portions, including four zones on the x and y axes corresponding to the directions of the longitudinal and lateral pattern features of the reticle 30, as compared with the intensity of the other portions, is defined on the pupil plane of the projection lens system 31; by means of the illumination system (11, 12, 14, 15, 105, 16, 17, 18, 19, 20, 21, 22, 23, 24, 25, 26, 27 and 28), the circuit pattern of the reticle 30 is illuminated with uniform illuminance; and an image of the circuit pattern is projected by the projection lens system 31 upon the wafer 32, whereby the image of the circuit pattern is transferred (printed) onto the resist of the wafer 32. The effect of such projection exposure is as has been described hereinbefore and, with light of i-line, a fine pattern of 0.4 micron can be recorded on the resist of the wafer 32 sharply and stably.

While in this example the filter 17 and the stop member 18 are disposed in front of the integrator 19, they may be disposed just after the integrator, particularly at a location which is optically conjugate with the pupil plane of the projection lens system 31. Further, a stop member 18 which is shown in FIG. 6B and is used in a third embodiment, to be described later, may be used in substitution for the filter 17 and the stop member 18.

FIGS. 6A and 6B show a third embodiment of the present invention which is another example of a semiconductor device manufacturing projection exposure apparatus wherein an image of a fine pattern is projected in accordance with a method of the present invention.

In the drawings, corresponding elements or those elements having corresponding functions as those in FIGS. 5A–5C, are denoted by the same reference numerals. Comparing the apparatus of this embodiment with that of FIGS. 5A–5C, the former differs from the latter in that: as shown in FIG. 6B, the aperture of the stop member 18 comprises four separate apertures; in place of the cross ND filter, four separate filters 17a, 17b, 17c and 17d corresponding respectively to the separate apertures of the stop member 18 are used; and a pyramid-like prism 13 is inserted between the mirrors 12 and 14.

In this embodiment, the output of the quartered detector 42 is used not only for the opening/closing control of the shutter 15 but also for a different purpose or purposes. Additionally, the measuring unit (35–37) is used.

Now, referring mainly to the differences of the present embodiment to the preceding embodiments, advantageous features of the present embodiment will be explained.

If the integrator 19 is illuminated with light from the Hg lamp 11, without using the prism 13, the filters 17a–17d and the stop member 18, than a secondary light source having a light quantity distribution, like a Gaussian distribution, with a high peak at its center is formed on the light exit surface of the Integrator 19. Since the light exit surface of the integrator is optically conjugate with the pupil plane of the projection lens system 31, an effective light source having a peak of light quantity distribution, at the center of the pupil, is formed on this pupil plane. As described hereinbefore, the effective light source to be used in this aspect of the present invention is one as having a light quantity distribution with no peak at the pupil center and, therefore, it is necessary to block the light impinging on a portion about the center of the integrator 19. If, however, the stop member 18 is disposed simply in front of the integrator 19, a large portion of the light from the Hg lamp is intercepted and thus the loss of light quantity is large. In consideration thereof, in the present embodiment the pyramid-like prism 13 is interposed just after the elliptical mirror 12 to control the illuminance distribution on the optical integrator 19.

The Hg lamp 11 is so disposed that its light emitting portion coincides with the first focal point position of the elliptical mirror 12, and the light emanating from the Hg lamp 11 and reflected by the elliptical mirror 12 is transformed by the prism 13 into four light beams deflected in different directions. These four light beams are reflected by the mirror 14 and reach the position of the shutter 15. If the shutter 15 is open, the light beams are incident on the filter 16. By this filter 16, the i-line component is selected out of the emitted light spectrums of the Hg lamp 11, for ensuring the best performance of the projection lens system 31 for the projection of an image of the reticle 31 on a resist (photosensitive layer) of the wafer 32.

The four light beams from the filter 16 pass through the field lens 105 and then impinge on the filters 17a–17d, respectively, which are important components of this embodiment. These four filters serve as a correcting means for making the light quantities of the four light beams substantially uniform to thereby correct the symmetry in light quantity of four portions of the effective light source as formed on the light exit surface of the integrator 19 and thus that as formed on the pupil plane of the projection lens system 31. If adjustment of the light quantity attenuating function of each filter is desired, different types of ND filters may be prepared for each filter so that they may be used selectively. Alternatively, each filter may be provided by an interference filter and, by utilizing the band narrowness of the interference filter, the interference filter may be tilted to effect the adjustment.

The stop member 18 receives the four light beams from the filters 17a–17d. As shown in FIG. 6B, the stop member 18 has four circular apertures which correspond to the four light beams from the filters 17a–17d, in a one-to-one relationship. Thus, the integrator 19 is illuminated with four light beams from the four apertures of the stop member 18, whereby an effective light source such as shown in FIG. 3A and corresponding to the apertures of the stop member 18, is formed on the light exit surface of the integrator 19 and thus on the pupil plane of the projection lens system 31.

Usually, the apertures of the stop member 18 each may have a shape corresponding the outer configuration of each of small lenses constituting the integrator 19. If, therefore, each small lens of the integrator has a hexagonal sectional shape, each aperture may be formed with a hexagonal shape like the sectional shape of the small lens.

The light from the optical integrator 19 goes by way of the lens 20, the mirror 21, the lens 22 and the half mirror 23 to the blade device 24. Here, the light beams from the lenses of the integrator 19 are superposed one upon another on the plane of the blade device 24, whereby the blade device 24 is illuminated with uniform illuminance. Also, the half mirror 23 serves to reflect a portion of each light beam from each lens of the integrator 19, and the light blocking plate 40 is illuminated with the reflected light. Light passing through the aperture of the light blocking plate 40 is collected by the lens 41 on the quartered detector 42.

The light passing through the aperture of the blade device 24 is directed by the mirror 25, the lens 26, the mirror 27 and the lens 28 to the reticle 30. Since the aperture of the blade device 24 and the circuit pattern of the reticle 30 are in an optically conjugate relationship, the light beams from the lenses of the integrator 19 are superposed one upon another, also on the reticle 30. Thus, the reticle 30 is illuminated with uniform illuminance, and an image of the circuit pattern of the reticle 30 is projected by the projection lens system 31.

The detector sections of the quartered detector 42 correspond respectively to four separate portions of the effective light source such as shown in FIG. 3A, and each section is able to detect the light quantity in each corresponding portion independently of the others. By combining the outputs of all the sections, the opening/closing control for the shutter 15 can be effected, as described hereinbefore. On the other hand, by mutually comparing the outputs of the sections, any unbalance in proportion of the light quantities at the respective portions of the effective light source can be checked. Here, calibration among the detector sections of the quartered detector 42 is effective for enhanced reliability of the unbalance check. Such calibration will be described later.

The shape of the effective light source formed on the pupil plane Of the apparatus corresponds to the shape of the integrator 19. Since the integrator 19 itself is provided by a combination of small lenses, in a microscopic sense the light quantity distribution of the effective light source comprises a combination of discrete ones each corresponding to the shape of each lens. However, in a macroscopic sense, a light quantity distribution such as shown in FIG. 3A is provided.

In this embodiment, the light quantity monitor means (23 and 40–42) and the measuring unit (35–37) are used to check the light quantity distribution of the effective light source. To this end, the X–Y stage 34 is moved to place the measuring unit (35–37) to a position just below the projection lens system 31. In this measuring unit, light emanating from the illumination system and reaching the image plans of the projection lens system 31 is directed through the aperture 35a of the glass plate 35 and the aperture of the casing 36 to the photoelectric converter 37. The light receiving plane of the aperture 35a is placed at the image plane position of the projection lens system 31. The glass plate 35 is attached to the casing 36 and, as described, the casing 36 has an aperture at a center thereof. In this example, the measuring unit is so arranged that the aperture of the casing 36 is displaceable to the aperture of the glass plate 35 by a predetermined amount. When illumination is provided with the illumination system of this embodiment, on the top of the casing 36, four portions of an effective light source such as shown In FIG. 3A are provided. The size and shape of the aperture of the casing 36 can be changed, as the aperture of the blade device 24. By changing the size and/or the shape of the aperture by means of a driving system (not shown), it is possible to detect each of the four portions of the effective light source independently of the others or, alternatively, it is possible to detect the four portions of the effective light source at once. On the other hand, the photoelectric converter 37 has a light receiving portion of an area sufficient to receive all the light passing through the aperture 35a of the glass plate 35. If the area of the light receiving portion of the photoelectric converter 37 is too large and the response characteristic of the electrical system degrades, a condensing lens may be inserted between the glass plate 35 and the photoelectric converter 37 to collect the light from the aperture 35a of the glass plate 35. This is effective to reduce the area of the light receiving portion of the photoelectric converter 37 to thereby improve the response characteristic. Further, if desired, the uniformness of the illuminance on the image plane can be measured by moving the X–Y stage 34 along the image plane while holding the aperture of the casing 36 in a state for concurrent detection of all the four portions of the effective light source.

The result of measurement of the light quantity (intensity) in each portion of the effective light source obtained through cooperation of the movement of the casing 36, is compared with an output of a corresponding one of the detector sections of a the quartered detector 42 at the illumination system side. Namely, the photoelectric converter 37 at the X–Y stage 34 side is used as a reference detector for calibration of the output of the quartered detector 42. This allows stable monitoring of any change with time of the effective light source. Then, any unbalance in light quantity of the portions of the effective light source can be detected by means of the quartered detector 42 or the photoelectric converter 37, and light quantity matching of the portions of the effective light source can be done by using the filters 17a–17d.

In this embodiment: through the function of the stop member 18 shown in FIG. 6B, an effective light source not having any peak of light quantity distribution on the x or y axis, corresponding to the directions of the longitudinal and lateral pattern features of the reticle 30, or at the pupil center (optical axis), is defined by zero-th order light on the pupil plane of the projection lens system 31, while on the other hand, by means of the illumination system (11, 12, 13, 14, 15, 16, 17, 18, 19, 20, 21, 22, 23, 24, 25, 26, 27 and 28), the circuit pattern of the reticle 30 is illuminated with uniform illuminance. Thus, an image of the circuit pattern is projected by the projection lens system 31 upon the wafer 32, whereby the image of the circuit pattern is transferred to the resist of the wafer 32. The effect of such projection exposure is as has been described hereinbefore with reference to FIGS. 3 and 4 and, with the use of light of i-line, a fine pattern of 0.4 micron can be recorded on the resist of the wafer 32 sharply and stably.

Figure 7:
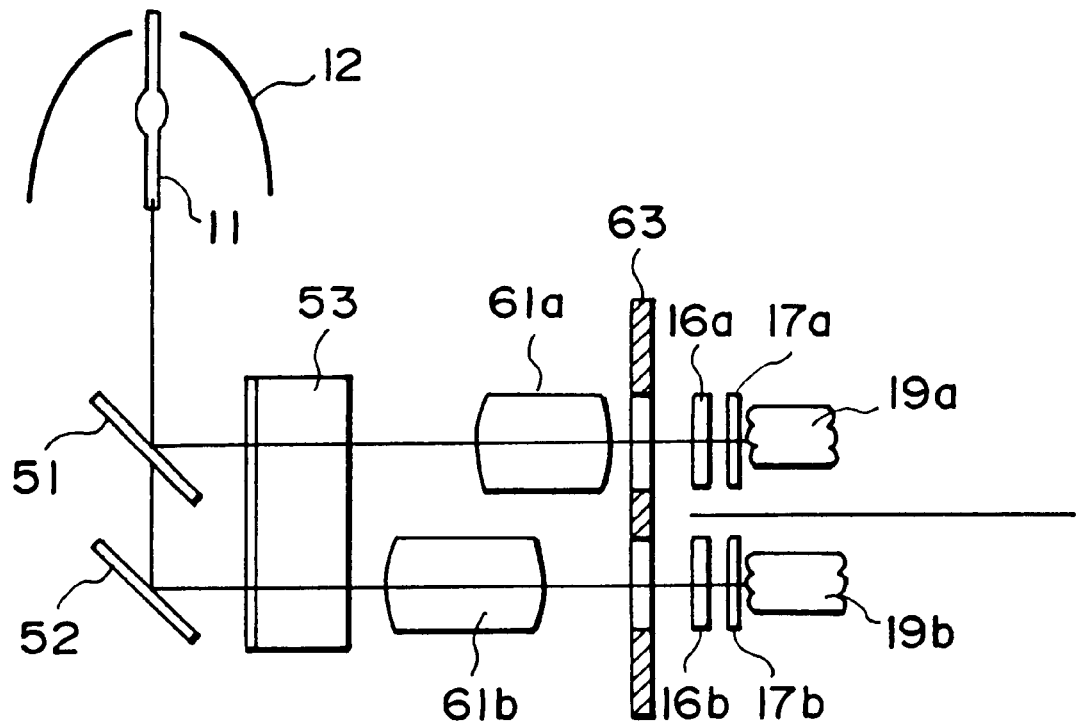
FIG. 7 is a fragmentary schematic view of a projection exposure apparatus according to a fourth embodiment of the present invention.

FIG. 7 is a fragmentary schematic view of a fourth embodiment of the present invention, which is an improved form of the semiconductor device manufacturing projection exposure apparatus of FIG. 6. The elements of FIG. 7 corresponding to the FIG. 6 embodiment are denoted by the same reference numerals as those of FIG. 6.

In the drawing, denoted at 11 is an ultra-high pressure Hg lamp, and denoted at 12 is an elliptical mirror. In this example, light emanating from the elliptical mirror 12 is divided by a combination of beam splitters (51–53). More specifically, in order to provide an effective light source having four portions such as shown in FIG. 3A, the light emanating from the elliptical mirror 12 is divided sequentially by means of a first beam splitter 51 and a second beam splitter 53. Denoted at 52 is a deflecting mirror for deflecting the light path. The second beam splitter 53 is disposed obliquely across the light paths of the two light beams as divided by the first beam splitter 51, and it serves to divide each of the two light beams advancing along the sheet of the drawing and to deflect a portion of each of the two light beams in a direction perpendicular to the sheet of the drawing. The remaining portion of each of the two light beams, not deflected, goes along the sheet of the drawing, as illustrated. A mirror optical system (not shown) is disposed on the path of that portion of light as deflected by the second beam splitter 53, and it serves to reflect and direct that portion of light along a path parallel to the path of light not deflected by the second beam splitter. In this manner, by means of the beam splitters 51 and 53 and the mirror 52 as well as the unshown mirror optical system, the light path is divided into four light paths. These light paths are then combined so as to form a secondary light source with a light distribution such as shown in FIG. 3A, on the light exit surface of the integrator 19. As a result, on the pupil plane of the projection lens system 31, an effective light source such as shown in FIG. 3A is formed.

On the two divided light paths which are present on the sheet of the drawing, relay lenses 61a and 62a are disposed, respectively. These relay lenses 61a and 62a serve to collect the light beams, advancing along the respective paths, on the integrator 19. Since the insertion of the first beam splitter causes a difference in optical path length between these two light paths, the relay lenses 61a and 61b are slightly different from each other with respect to the structure and the focal length. This is also the case with an additional pair of relay lenses (not shown) which are disposed on the pair of light paths, not shown in the drawing.

Denoted at 63 is a shutter which can be controlled (opened/closed) for each of the four light beams provided by the beam splitters 51 and 53. Denoted at 16a and 16b are wavelength selecting filters disposed on the two divided light paths, respectively, which are present on the sheet of the drawing. While not shown in the drawing, similar filters are disposed on the two light paths which are not on the sheet of the drawing. These filters each serve to extract the i-line component out of the light from the Hg lamp, as the filter 16 of the preceding embodiment. Denoted at 17a and 17b are filters disposed on the two divided paths in the sheet of the drawing, each for adjusting the light quantity in a corresponding portion of the effective light source. Similar filters are disposed on the two light paths not included in the sheet of the drawing. These filters have a similar function as those of the filters 17a–17d of the preceding embodiment.

In this embodiment, the light path to the integrator is divided into four and, for this reason, the integrator is provided by a combination of four small integrators. Because of the relationship of superposition of the light paths, only two integrators 19a and 19b are illustrated in the drawing. Since the structure after the integrators is similar to that of the preceding embodiment, further description will be omitted for simplicity.

Figure 8:
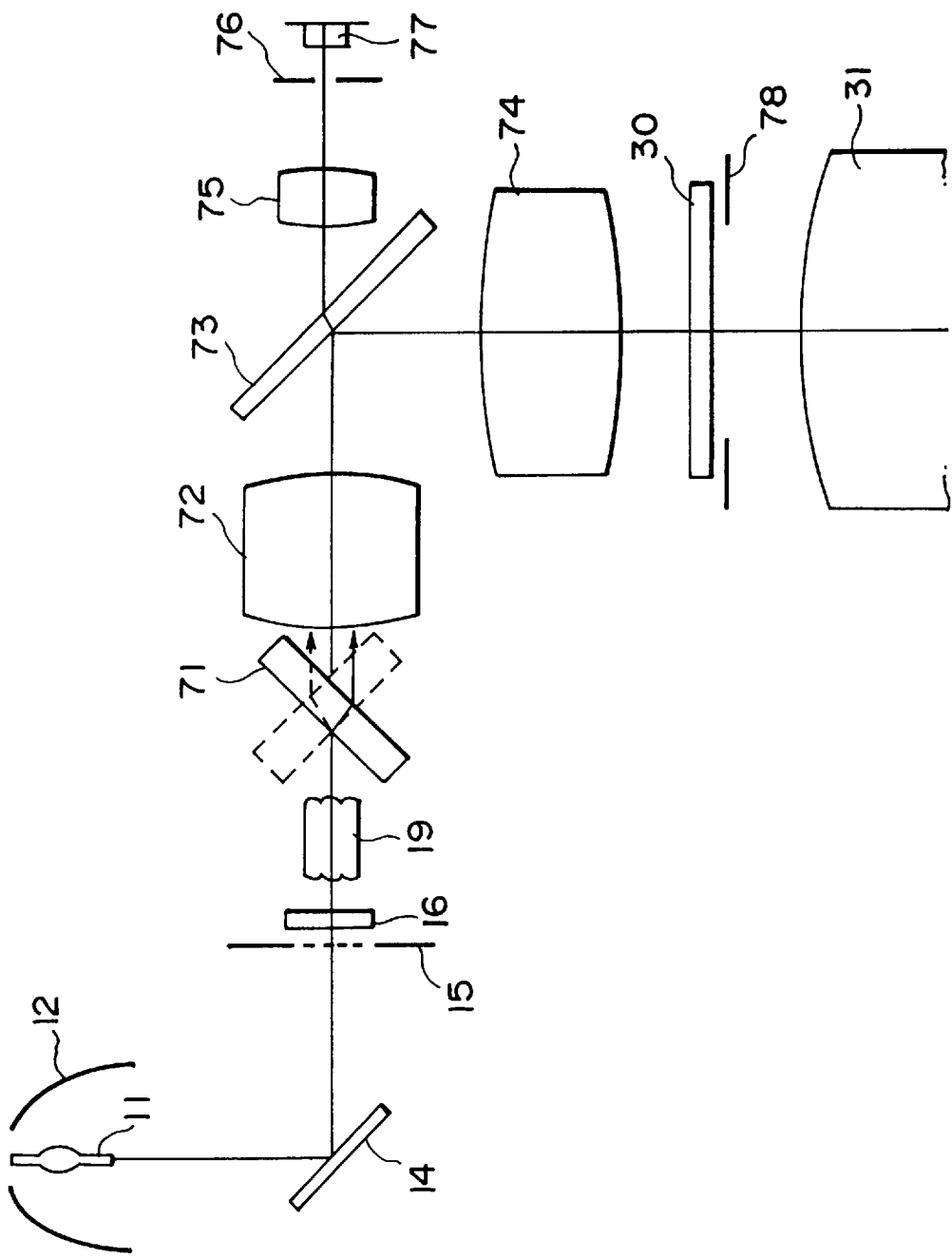
FIG. 8 is a fragmentary schematic view of a projection exposure apparatus according to a fifth embodiment of the present invention.

FIG. 8 is a fragmentary schematic view of a fifth embodiment of the present invention, showing a semiconductor device manufacturing projection exposure apparatus wherein an image of a fine pattern is projected in accordance with a method of the present invention.

In the apparatus of this embodiment, the position of an effective light source is changed with time to thereby form an equivalent effective light source as of that shown in FIG. 3A is formed on the pupil plane, and the image of a circuit pattern is projected. In FIG. 8, the elements corresponding to those of the preceding embodiments are denoted by the same reference numerals. Thus, denoted at 11 is an ultra-high pressure Hg lamp; denoted at 12 is an elliptical mirror; denoted at 14 is a deflecting mirror; denoted at 15 is a shutter; denoted at 16 is a wavelength selecting filter; and denoted at 19 is an optical integrator. The unshown portion, after the projection lens system 31, has the same structure as that of the preceding embodiments.

An important feature of this embodiment resides in that a flat parallel plate 71 which is movable with time is disposed after the integrator 19. The parallel plate 71 is disposed obliquely to the optical axis of the illumination optical system, and it is swingable to change the angle with respect to the optical axis, as illustrated, to shift the optical axis. This means that, if the integrator 19 is observed through the flat parallel plate 71, from the reticle 30 side, the integrator 19 appears to move up and down or left and right with the swinging movement of the parallel plate 71. In this example, the parallel plate 71 is so supported that it can be moved also rotationally about the optical axis. Therefore, by rotationally moving the parallel plate 71 while retaining its inclination at a predetermined angle to the optical axis, upon the pupil plane of the projection lens system 31 it is possible to place a single effective light source at a desired position on a circumference of a certain radius, spaced from the optical axis (pupil center). For actual exposure operation, the parallel plate 71 is moved and, when the single effective light source comes to a desired position, the attitude of the parallel plate is fixed and the exposure is affected for a predetermined time period. Such operation is executed four times so as to provide a single light source at each of the four portions of the effective light source as shown in FIG. 3A and, then, the exposure of one shot area (of the wafer) is completed.

In this embodiment, the Hg lamp 11 is used as a light source. It a light source of pulse emission type such as an excimer laser is used, the parallel plate 71 may be moved uninterruptedly and the exposure control may be such that the light source is energised when the parallel plate 71 comes to a predetermined position. In such a case, conveniently an excimer laser is used as a light source and the period of rotation of the parallel plate 71 about the optical axis may be selected to be matched with the emission repetition frequency of the excimer laser. As an example, if the laser used emits at 200 Hz, then efficient exposure is attainable by so controlling the number of revolutions of the parallel plate that the effective light source displaces to an adjacent quadrant in response to each light emission.

When the system is arranged so that a single effective light source displaces with time, the effective light source portions (distributions) as defined in different portions of the pupil are provided by the light energy from one and the same light source and, therefore, it is easy to set, at the same intensity, the effective light source portions to be separately defined on the pupil plane. This is the very reason why the filter 17, used in the preceding embodiments for correction of light quantity of the effective light source, is not provided.

Referring back to the drawing, the light passing through the parallel plate 71 goes by way of a lens 72, a half mirror 73 and a lens 74, and it illuminates the reticle 30 uniformly. Since the first imaging optical system used in the preceding embodiments is not used in this embodiment, a blade device 74 separate from the blade device 24 of the preceding embodiments is provided in the neighborhood of the reticle 30. The blade device 74 has a similar structure and a similar function as of those of the blade device 24, and the size of the aperture thereof can be changed in accordance with the size of the circuit pattern formed on the reticle 30.

The mirror 73 serves to reflect almost all the portion of the light inputted thereto, but it also serves to transmit and direct a portion of the input light to a light quantity monitor, provided for exposure control. Denoted at 75 is a condenser lens, and denoted at 76 is a pinhole plate which is disposed at a position optically equivalent to that of the reticle 30. Light from the mirror 73 is collected by the condenser lens 75 upon the pinhole plate 76, and light passing through the pinhole plate 76 is received by a photodetector 77. The photodetector 77 produces a signal corresponding to the intensity of light impinging on it. On the basis of this signal, an unshown computer of the apparatus controls the opening/closing of the shutter 15. It is to be noted here that, since in this embodiment it is not necessary to monitor the light quantity ratio of the portions of the effective light source, the photodetector 77 may be of a type other than a quartered detector.

In this embodiment: while an effective light source such as shown in FIG. 3A is defined on the pupil plane of the projection lens system 31, the circuit pattern of the reticle is illuminated with uniform illuminance. Thus, an image of the circuit pattern is projected by the projection lens system 31, whereby the image of the circuit pattern is transferred to the resist of the wafer. The effect of such projection exposure is as has been described hereinbefore, and a fine pattern of 0.4 micron can be recorded on the resist of the wafer 32 sharply and stably.

FIG. 9 is a fragmentary schematic view of a sixth embodiment of the present invention, showing a semiconductor device manufacturing projection exposure apparatus wherein an image of a fine pattern is projected in accordance with a method of the present invention.

In this embodiment, a KrF excimer laser 81 (center wavelength 248.4 nm and bandwidth 0.03–0.05 nm) is used as a light source. Important features reside in that: since the excimer laser 81 is of pulse emission type, no shutter is provided and the exposure control is done through the actuation control of the laser itself; and, since the laser itself is equipped with a filter and the bandwidth of laser light is narrowed, no wavelength selecting filter is provided. The beam splitters 51 and 53, the mirror 52, the filter 17 and the integrator 19 have a similar function as those of the embodiment shown in FIG. 7. The portion after the integrator 19 is of a similar structure as shown in FIG. 6A, except that a projection lens system (not shown) is provided by a lens assembly designed with respect to a wavelength 248.4 nm and consisting of silica (main component).

In the excimer laser 81, the laser light has high coherency and therefore, it is necessary to suppress production of a speckle pattern. To this end, in this embodiment, an incoherency applying unit 82 is provided at a position after the light is divided by the beam splitter group (51–53). While many proposals have been made as to how to remove the speckle in an illumination optical system using an excimer laser, the provision of an effective light source in accordance with the present invention is essentially compatible to them, and various known methods may be used. In consideration of this, details of the unit 82 are omitted here.

In this embodiment: while an effective light source such as shown in FIG. 3A is defined on the pupil plane of the projection lens system 31 through the illustrated illumination optical system (17, 19, 51, 52, 53 and 82), the circuit pattern of the reticle is illuminated with uniform illuminance. Thus, an image of the circuit pattern of is projected by the projection lens system 31, whereby the image of the circuit pattern is transferred to the resist of the wafer. The effect of such projection exposure is as has been described hereinbefore, and a fine pattern of 0.3–0.4 micron can be recorded on the resist of the wafer 32 sharply and stably.

FIG. 10 is a fragmentary schematic view of a seventh embodiment of the present invention, which is an improved form of the apparatus of the sixth embodiment shown in FIG. 9.

In this embodiment, laser light from a laser 81 is divided into four light beams by a reflection type pyramid-like prism. While in the apparatus of FIG. 6 a transmission type pyramid-like prism 13 is used for the light division, the same effect is attainable by using a reflection type one. As a matter of course, the structure of this aspect of the present invention can be realized by using an ultra-high pressure Hg lamp but, in this example, a KrF excimer laser is used as a light source. The laser light emanating from the laser 81 is transformed into an appropriate beam diameter by means of an afocal beam converter 91 and, after this, it enters a pyramid-like prism 92. The arrangement of the pyramid-like prism is so set that four reflection surfaces thereof are oriented to define, as a result, an effective light source such as shown in FIG. 3B, at the pupil position of the projection lens system (not shown). Denoted at 93 are mirrors for deflecting the lights as divided and reflected by the reflection surfaces of the prism 92. The portion after the mirrors 93 has a similar structure as that of the apparatus of FIG. 9, whereas the portion after the integrator 19 has a similar structure as that of FIG. 6A, except that the unshown projection lens system is provided by a lens assembly designed with respect to a wavelength of 248.4 nm and consisting of silica (main component).

Also in this embodiment: while an effective light source such as shown in FIG. 3A is defined on the pupil plane of the projection lens system 31 through the illustrated illumination optical system (17, 19, 91, 92, 93 and 82), the circuit pattern of the reticle is illuminated with uniform illuminance. Thus, an image of the circuit pattern is projected by the projection lens system 31, whereby the image of the circuit pattern is transferred to the resist of the wafer. The effect of such projection exposure is as has been described hereinbefore, and a fine pattern of 0.3–0.4 micron can be recorded on the resist of the wafer 32 sharply and stably.

Figure 11:
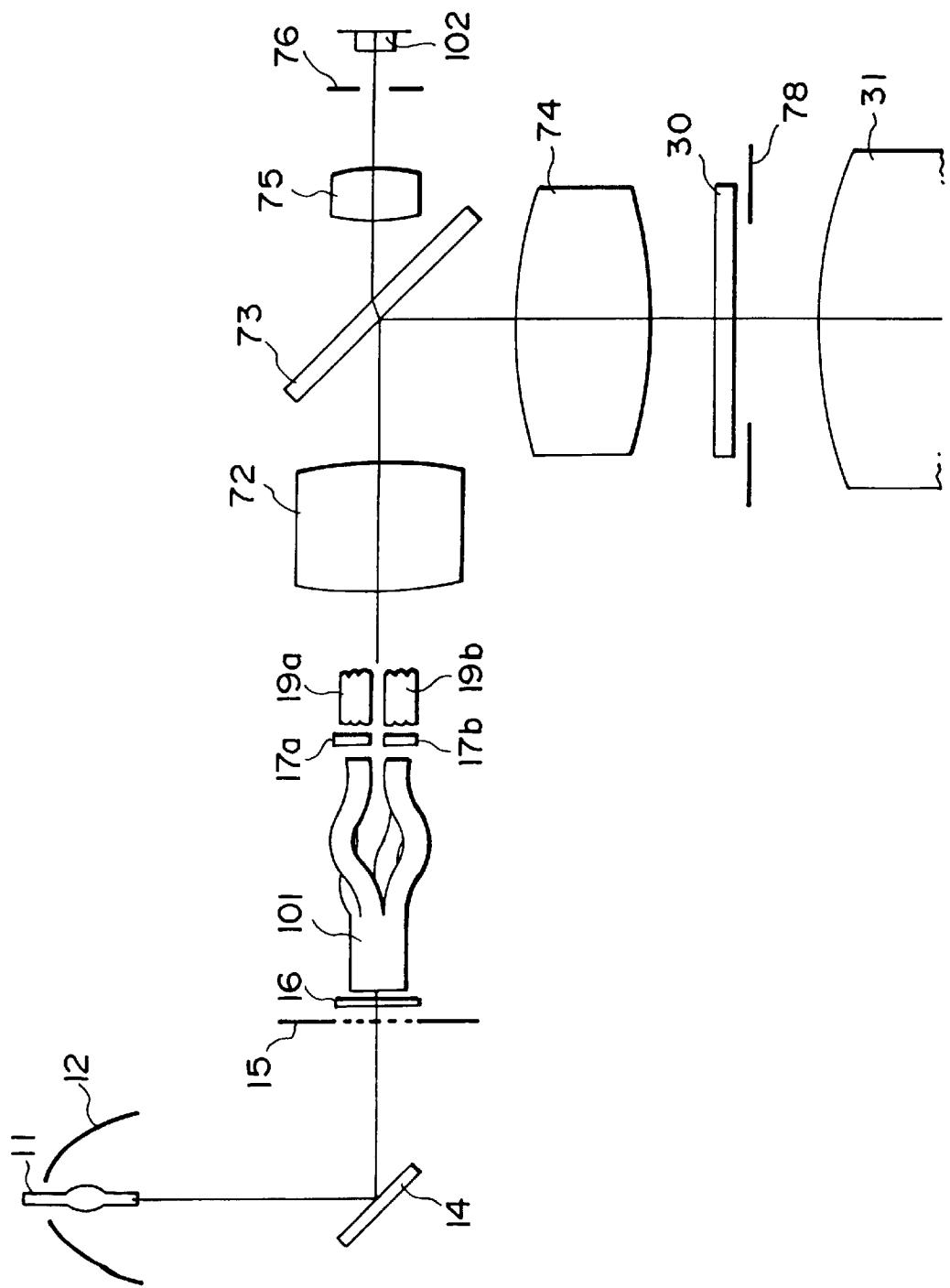
FIG. 11 is a fragmentary schematic view of a projection exposure apparatus according to an eighth embodiment of the present invention.

FIG. 11 is a fragmentary schematic view of an eighth embodiment of the present invention, showing another form of a semiconductor device manufacturing projection exposure apparatus wherein an Image of a fine pattern is projected in accordance with a method of the present invention.

In this embodiment, an illumination system using a bundle of fibers 101 is shown. The fiber bundle 101 has a light entrance surface disposed at a position whereat light from an ultra-high pressure Hg lamp 11 is focused by an elliptical mirror 12. Light beams are propagated through the fibers and are directed to the light entrance surfaces of the integrators 19. The end portion of the fiber bundle remote from the ultra-high pressure Hg lamp 11, that is, the end portion at the light exit surface thereof, is branched into four bundles corresponding respectively to the portions of the effective light source shown in FIG. 3A. Filters 17 are disposed at the exits of the fiber bundles, respectively, for adjustment of light quantities in the portion of the effective light source. The optical arrangement of the remaining portion of the apparatus is provided by the same structure as that of the FIG. 8 embodiment. However, as a photodetector for the light quantity monitoring, a quartered detector 102 is used to detect the balance of light quantities from the fiber bundles (i.e. four portions of the secondary light source and thus four portions of the effective light source). The detector sections of the quartered detector 102 correspond to the exits of the four integrators 19, respectively.

In this embodiment: while an effective light source such as shown in FIG. 3A is defined on the pupil plane of the projection lens system 31, the circuit pattern of the reticle is illuminated with uniform illuminance; and an Image of the circuit pattern is projected by the projection lens system 31, whereby the image of the circuit pattern is transferred to the resist of the wafer. The effect of such projection exposure is as has been described hereinbefore, and a fine pattern of 0.4 micron can be recorded on the resist of the wafer 32 sharply and stably.

FIG. 12 is a fragmentary schematic view of a ninth embodiment of the present invention, showing another example of a semiconductor device manufacturing projection exposure apparatus wherein an image of a fine pattern is projected in accordance with a method of the present invention.

In this embodiment, an illumination system is provided by using a plurality of light sources. In this example, ultra-high pressure Hg lamps 11a and 11b are used. However, it is a possible alternative to use an excimer laser and to construct a laser optical system, that is, an optical system for a parallel beam of small divergence angle.

While not shown in the drawing because of superposition, four ultra-high pressure Hg lamps are used in this embodiment. Light beams from these four Hg lamps enter a concave lens 103. Then the light passes through a wavelength selecting interference filter 16 and four filters, for the adjustment of light quantities in the portions of the effective light source, and is received by the integrators 19. The optical arrangement after the integrators 19 is similar to that of the FIG. 11 apparatus, and an effective light source such as shown in FIG. 3A is formed on the pupil plane of the projection lens system 31. Thus, also in this embodiment, an image of the circuit pattern of the reticle 31 is projected on the wafer, whereby the image of the circuit pattern of the reticle is transferred to a resist of the wafer. The effect of such projection exposure is as has been described hereinbefore, and a fine pattern of 0.4 micron can be recorded on the resist of the wafer, sharply and stably.

In the semiconductor device manufacturing projection exposure apparatus having been described in the foregoing, the arrangement of the effective light source on the pupil plane is fixed. However, as described in the introductory portion of the Specification, the parameter p representing the center position of each portion of the effective light source and the parameter q representing the radius of each portion or the radius of a circle circumscribing it as well as the shape of each portion of the effective light source are to be optimized in accordance with a circuit pattern which is the subject of the projection exposure. In consideration thereof, it in desirable to arrange the system so that in each embodiment the parameters p and q, for example, are made changeable. By way of an example, in an embodiment which uses the stop member 18, a stop member having a variable aperture shape may be used therefor or, alternatively, different stop members having apertures of different shapes may be prepared.

Further, the apparatuses described hereinbefore are those for the manufacture of semiconductor devices However, the invention is not limited to the projection of an image of an integrated circuit pattern. That is, the invention is applicable to many cases wherein an image of an article having a fine pattern mainly consisting of longitudinal and lateral pattern features, is to be projected through an optical system.

Further, while in the apparatuses described hereinbefore the image projecting optical system comprises a lens system, the invention is applicable also to a case wherein a mirror system is used therefor.

Still further, while the apparatuses described hereinbefore use light of i-line or laser light of wavelength 248.4 nm for the image projection, the applicability of the present invention does not depend on the wavelength. Thus, as an example, the invention is applicable to a semiconductor device manufacturing projection exposure apparatus which uses light of g-line (436 nm).

As described in the foregoing, through formation of a specific effective light source on a pupil of an image projection optical system, an image of a fine pattern having a very high frequency can be projected with a similar resolution as attainable with a phase shift mask and, conveniently, with a simple process as compared with the use of the phase shift mask.

As described, the present invention has paid a particular note to the necessary resolution for and the directionality of a pattern of a semiconductor integrated circuit and proposes selection of an optimum illumination method, best suited to the spatial frequency and the directionality of that pattern.

Some embodiments to be described below have an important feature that: in order to meet the semiconductor integrated circuit manufacturing processes including steps of a maximum number not less than 20 (twenty), an illumination device has a conventional illumination system and a high-resolution illumination system which can be easily interchanged.

Figure 13:
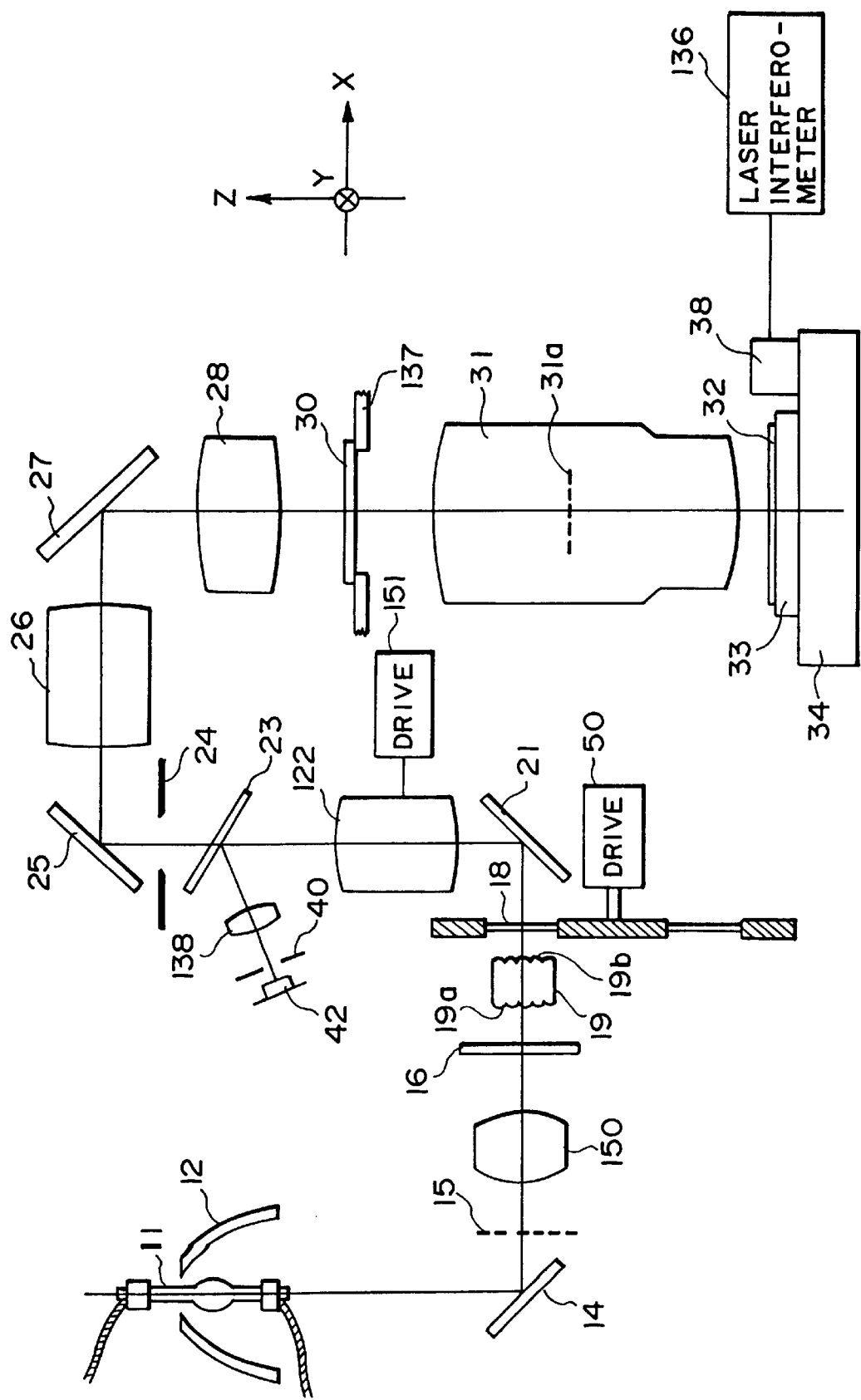
FIG. 13 is a schematic view of a main portion of a projection exposure apparatus according to a tenth embodiment of the present invention.

FIG. 13 is a schematic view of a main portion of an embodiment of the present invention. Denoted at 11 is a light source such as an ultra-high pressure Hg lamp, for example, having its light emitting point disposed adjacent to a first focal point of an elliptical mirror 12. The light emanating from the lamp 11 is collected by the elliptical mirror 12. Denoted at 14 is a mirror for deflecting the light path, and denoted at 15 is a shutter for limiting the quantity of light passing therethrough. Denoted at 150 is a relay lens system which serves to collect the light from the Hg lamp 11 on an optical integrator 19, through a wavelength selecting filter 16. The optical integrator 19 is provided by small lenses arrayed two-dimensionally, to be described later.

In this embodiment, the optical integrator 19 may be illuminated in accordance with either a "critical illumination method" or a "Kohler illumination method". Also, it may be that the light exit portion of the elliptical mirror Is imaged on the optical integrator 19. The wavelength selecting filter 16 serves to select and pass light of a necessary wavelength component or components (e.g. i-line or g-line), out of the wavelength components of the light from the Hg lamp 11.

Denoted at 18 is a stop shape adjusting member (selecting means for selecting intensity distribution of the secondary light source), for adjusting the shape of a stop, and it comprises a plurality of stops provided in a turret arrangement. The adjusting member is disposed after the optical integrator, more particularly, adjacent to the light exit surface 19b of the integrator 19. The stop shape adjusting member 18 serves to select predetermined ones of small lenses, constituting the optical integrator 19, in accordance with the shape of the integrator 19. Namely, in this embodiment, by using the stop shape adjusting member 18, an illumination method suitable for the shape of a pattern of a semiconductor integrated circuit to be exposed (to be described later) is selected. Details of the selection of small lenses will be described later.

Denoted at 21 is a mirror for deflecting the light path, and denoted at 122 is a lens system for collecting the light passing through the adjusting member 18. The lens system 122 plays an important role for the control of uniformness of illumination. Denoted at 23 is a half mirror for dividing the light from the lens system 122 into a transmitted light and a reflected light. Of these lights, the light reflected by the half mirror 23 is directed through a lens 138 and a pinhole plate 40 to a photodetector 42. The pinhole plate 40 is disposed at a position optically equivalent to that of a reticle 30 having a pattern to be exposed (printed), and the light passing the pinhole plate is detected by the photodetector 42 for the control of the amount of exposure (based on control of the shutter 15).

Denoted at 24 is a masking mechanical blade device, and the position thereof Is adjusted by means of a driving system (not shown) in accordance with the size of a pattern of the reticle 30, to be exposed. Denoted at 25 is a mirror, denoted at 26 is a lens system, denoted at 27 is a mirror, and denoted at 28 is a lens system all of which serve to illuminate the reticle 30, placed on a reticle stage 137, with the light from the Hg lamp.

Denoted at 31 is a projection optical system for projecting and imaging the pattern of the reticle 30 upon a wafer 32. The wafer 32 is attracted to and held by a wafer chuck 33 and, also, it is placed on an X–Y stage 34 whose position is controlled by means bf a laser interferometer 136 and an unshown controller. Denoted at 38 is a mirror mounted on the X–Y stage 34, for reflecting light from the laser interferometer.

In this embodiment, through the adjusting member 18, a secondary light source is formed at the light exit surface 19b side of the optical integrator 19, and the light exit surface of the integrator 19 Is disposed in an optically conjugate relationship with the pupil plane 31a of the projection optical system 31 through the elements 21, 122, 25, 26, 27 and 28. Thus, an effective light source image corresponding to the secondary light source is formed on the pupil plane 31a of the projection optical system 31.

Referring now to FIG. 14, the relationship between the pupil plane 31a of the projection optical system 31 and the light exit surface 19b of the optical integrator 19 will be explained. The shape of the effective light source as formed on the pupil plane 31a of the projection optical system 31 corresponds to the shape of the optical integrator 19. FIG. 14 shows this, and in the drawing the shape of the effective light source image 19c of the light exit surface 19b formed on the pupil plane 31a of the projection optical system 31 is illustrated superposedly. For standardization, the diameter of the pupil 31a of the projection optical system is taken as 1.0 and, in this pupil 31a, the light exit surfaces of the small lenses constituting the optical integrator 19 are imaged to provide the effective light source image 19c. In this embodiment, each small lens of the optical integrator 19 has a square shape.

Here, the orthogonal axes which are the major directions to be used in designing a pattern of a semiconductor integrated circuit, are taken on x and y axes. These directions correspond to the major directions of the pattern formed on the reticle 30, respectively, and also substantially correspond to the directions (longitudinal and lateral sides) of the outer configuration of the reticle 30 having a square shape. As described and as is well known in the art, usually the orthogonal axes used in the pattern designing correspond to x and y axes defined in the projection exposure apparatus with respect to which a reticle is to be placed on the reticle stage. Also, the x and y axes correspond to x and y axes along which the X–Y stage 34 is moved.

The high-resolution illumination system shows its best performance particularly when the $k_1$ factor as described has a level near 0.5. In consideration of this, in this embodiment, through the restriction by the adjusting member 18, only those light beams passing through particular ones of small lenses of the optical integrator 19, as selected in accordance with the shape of the pattern on the reticle 30 surface, are used for the illumination of the reticle 30. More specifically, the selection of small lenses is so made as to assure that the light passes those regions of the pupil plane 31a of the projection optical system 31 other than the central region thereof.

FIGS. 15A and 15B are schematic views of the pupil plane 31a, respectively, each showing the result of selection of those light beaus passing particular ones of the small lenses of the optical integrator 19 made by the restriction by the adjusting member 18. In each of these drawing, the painted area corresponds to the light blocking region while the non-painted areas correspond to the regions through which the light passes.

FIG. 15A shows an effective light source image on the pupil plane 31a to be defined on an occasion when, for a pattern, the directions with respect to which the resolution is required correspond to the x and y axes, respectively. Assuming now that the circle representing the pupil plane 31a is expressed by:

$$x^2+y^2=1,$$

the following four circles are considered:

$$(x-1)^2+y^2=1$$

$$x^2+(y-1)^2=1$$

$$(x+1)^2+y^2=1$$

$$x^2+(y+1)^2=1$$

By these four circles, the circle representing the pupil plane 31$a$ is divided into eight regions 101–108.

In this embodiment, an illumination system having high resolution and large depth of focus with respect to the x and y directions, can be assured by preferentially selecting a group of small lenses present in even-numbered regions, namely, the regions 102, 104, 106 and 108, so an to pass the light through the selected mall lenses. Thus, as an example, a stop 18$b$ or 18$c$ illustrated in FIG. 16 is selected and the projection exposure is effected. Those small lenses around the origin (x=0, y=0) have a large effect in enhancement of depth of focus chiefly with regard to a pattern of a relatively wide linewidth and, therefore, whether such small lenses are to be selected or not is a matter of choice which may be determined in accordance with a pattern to be printed.

In the example of FIG. 15A, those small lenses around the center are excluded and, thus, the formed effective light source is substantially equivalent to that shown in FIG. 3A. It is to be noted here that the outside portion of the optical integrator 19 is blocked, against light, within the illumination system by means of an integrator holding means (not shown). Also, in FIGS. 15A and 15B, for better understanding of the relationship between the small lenses and the pupil plane 31$a$ of the projection optical system 31, the pupil plane 31$a$ and the effective light source image 19$c$ of the optical integrator 19 are illustrated superposedly.

FIG. 15B shows an example of restriction on an occasion when high resolution is required with regard to a pattern with features extending in ±45 deg. directions. Like the case of FIG. 15A, the relationship between the pupil 31$a$ and the effective light source image 19$c$ of the optical integrator 19 is Illustrated. For a ± pattern, under the same condition, the following four circles may be drawn superposedly on the pupil 31$a$:

$$(x-1/\sqrt{2})^2+(y-1/\sqrt{2})^2=1$$

$$(x+1/\sqrt{2})^2+(y-1/\sqrt{2})^2=1$$

$$(x+1/\sqrt{2})^2+(y+1/\sqrt{2})^2=1$$

$$(x-1/\sqrt{2})^2+(y+1/\sqrt{2})^2=1,$$

and, like the example of FIG. 15A, the pupil 31$a$ is divided into eight regions 111–118. On this occasion, those which are contributable to the enhancement of the resolution of a pattern with features of ±45 deg. are odd-numbered regions, that is, the regions 111, 113, 115 and 117. By preferentially selecting those small lenses of the optical integrator which are present in these regions, for the pattern with features of ±45 deg. and a $k_1$ factor of a level of about 0.5, the depth of focus increases considerably. Thus, as an example, a stop 18$d$ such as shown in FIG. 16 is selected and the projection exposure is effected.

FIG. 16 is a schematic view of interchangeable stops 18$a$–18$d$ of the adjusting member 18. As illustrated, a turret type interchanging structure Is used. The first stop 18$a$ is used when a pattern which Is not very fine, as having a $k_1$ factor of not less than 1, is to be printed. The first stop 18$a$ has the same structure as in a conventional illumination system known in the art, and which serves to block, against light, the outer portion of a small lens group of the optical integrator 19. The stops 18$a$–18$d$ are those added in accordance with the present invention.

Generally, in an illumination system for high resolution, an advantageous result is obtainable to a high spatial frequency when a region of the optical integrator which is, on the pupil plane, outside of the size as required in the conventional type illumination system, is also used. As an example, in the conventional type illumination system it may be preferable to use those small lenses which are present within a radius of 0.5; whereas in an illumination system for high resolution, although small lenses around the center are not used, there is a case wherein those small lenses present within a circle of a maximum radius of 0.75 on the pupil plane (the radius of the pupil plane is 1) should preferably be used.

For this reason, the sire of the optical integrator 19 as well as the effective diameter of the illumination system, for example, should be preferably determined while taking into account both the conventional type and the high-resolution type. Also, it is preferable that the light Intensity distribution at the light entrance surface 19$a$ of the optical integrator 19 has a sufficient size such that it functions sufficiently even if a stop 18 is inserted. The possibility of blocking the outer small lenses with the stop 18$a$ is because of the reason described above. Thus, as an example, there may be a case wherein, although at the optical integrator 19 side a maximum radius 0.75 is prepared, the stop 18$a$ chooses regions within a radius of 0.5.

By determining the shape of a stop in consideration of the specifications of a pattern of a semiconductor integrated circuit to be printed, as described, it is possible to arrange the exposure apparatus best suited for that pattern. The selection of stops may be made automatically in response to a signal applied from a computer, provided for overall control of the exposure apparatus. Illustrated in FIG. 16 is an example of stop shape adjusting member 18 formed with such stops. In this example, any one of four stops 18$a$–18$d$ can be selected. As a matter of course, the number of stops may be increased easily.

There is a case wherein the non-uniformness in illumination changes with the selection of a stop. In consideration of this, in this embodiment, such non-uniformness in illuminance can be finely adjusted by adjusting the lens system 122. Such fine adjustment can be done by adjusting the spacing between constituent lenses of the lens system 122 in the direction of the optical axis. Denoted at 151 is a driving mechanism for displacing one or more constituent lenses of the lens system 122. The adjustment of the lens system 122 may be effected in accordance with the selection of the stop. If desired, the lens system 122 as a whole may be replaced by another, in response to the change of the stop shape. On that occasion, different lens systems each corresponding to the lens system 122 may be prepared and, in a turret fashion, they may be interchanged in accordance with the selection of the stop shape.

In this embodiment, as described, the shape of the stop is changed so as to select an illumination system suited to the characteristics of the pattern of a semiconductor integrated circuit. Also, an important feature of this embodiment resides in that, when an illumination system for high resolution is set, in general form of the effective light source, the light source itself is divided into four regions. An important factor in this case is the balance of intensity in these four regions. However, in the arrangement shown in FIG. 13, there is a case wherein the shadow of a cable to the Hg lamp 11 adversely affects this balance. Therefore, in an illumination system for high resolution wherein the stop means shown in FIG. 15A or 15B is used, it is desirable to set the arrangement so that the linear zone corresponding to the shadow of the cable coincides with those small lenses of the optical integrator which are blocked against light.

More specifically, in the FIG. 15A example, preferably the cable 11a should be extended in the x or y directions, such as shown in FIG. 17A. In the FIG. 15B example, on the other hand, preferably the cable 11a should be extended at an angle of ±45 deg. with respect to the x and y directions. In this embodiment, preferably the direction of extension of the cable of the Hg lamp may be changed in response to the change of the stop.

Figure 18:
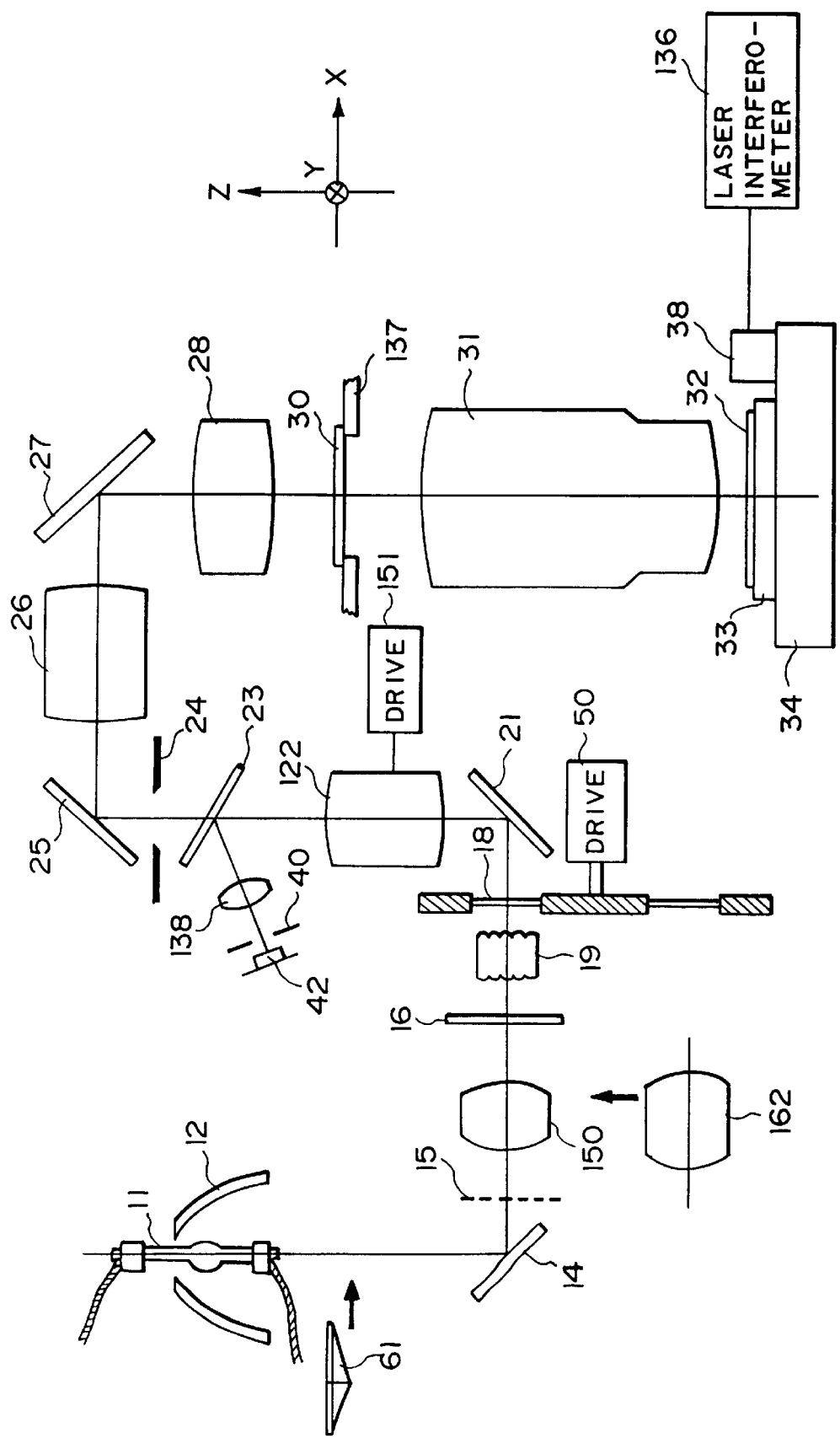
FIG. 18 is a schematic view of a main portion of a projection exposure apparatus according to a further embodiment of the present invention.

FIG. 18 is a schematic view of a main portion of another embodiment of the present invention. The system of FIG. 18 is the same as that of FIG. 13 with respect to the projection exposure of a pattern which is not very fine, as having a $k_1$ factor not less than 1. On the other hand, for the projection exposure of a fine pattern with a $k_1$ factor about 0.5, a stop such as shown in FIG. 15A or 15B is inserted in accordance with the directionality of the pattern, as described in the foregoing. In this case, however, since the system of FIG. 13 simply blocks the light, the efficiency of the use of the light from the Hg lamp 11 decreases. In consideration of this, the embodiment of FIG. 18 is arranged to assure effective use of light.

To this end, in the system of FIG. 18, as am important feature a pyramid-like prism 61 can be inserted between the elliptical mirror 12 and the mirror 14. The light beam produced from a portion near an electrode of the ultra-high pressure Hg lamp 11 is reflected by the elliptical mirror 12, and then it enters the pyramid-like prism 61 whereby four light source images, corresponding to the four surfaces constituting the prism, are formed on a plane including a second focal point of the elliptical mirror 12. Lens system 162 can be inserted in place of the lens system 150, to direct the light so that the four light source images correspond respectively to four separate light transmitting portions of an inserted stop.

In this embodiment, the pyramid-like prism to be inserted should be placed with specific orientation. For a stop of a shape such as shown in FIG. 15A, each ridge between adjacent surfaces of the prism 61 should be placed in alignment with the x or y direction (FIG. 19A). For correction of a change in the imaging relationship of the optical system due to the insertion of the prism, in the system of FIG. 18 the lens system 150 disposed after the shutter 15 is replaced by the lens system 162 simultaneously with the insertion of the prism.

On the other hand, in a case when the light transmitting regions of the stop are on the x and y axes, as in the FIG. 15B example, each ridge of the prism is set with angles of ±45 deg. with respect to the x and y axes (FIG. 19B). Also in this case, the lens 162 is used in place or the lens system 150 for the correction of the imaging relationship.

A plurality of pyramid-lime prisms may be prepared in accordance with the number of stops prepared.

Figure 20:
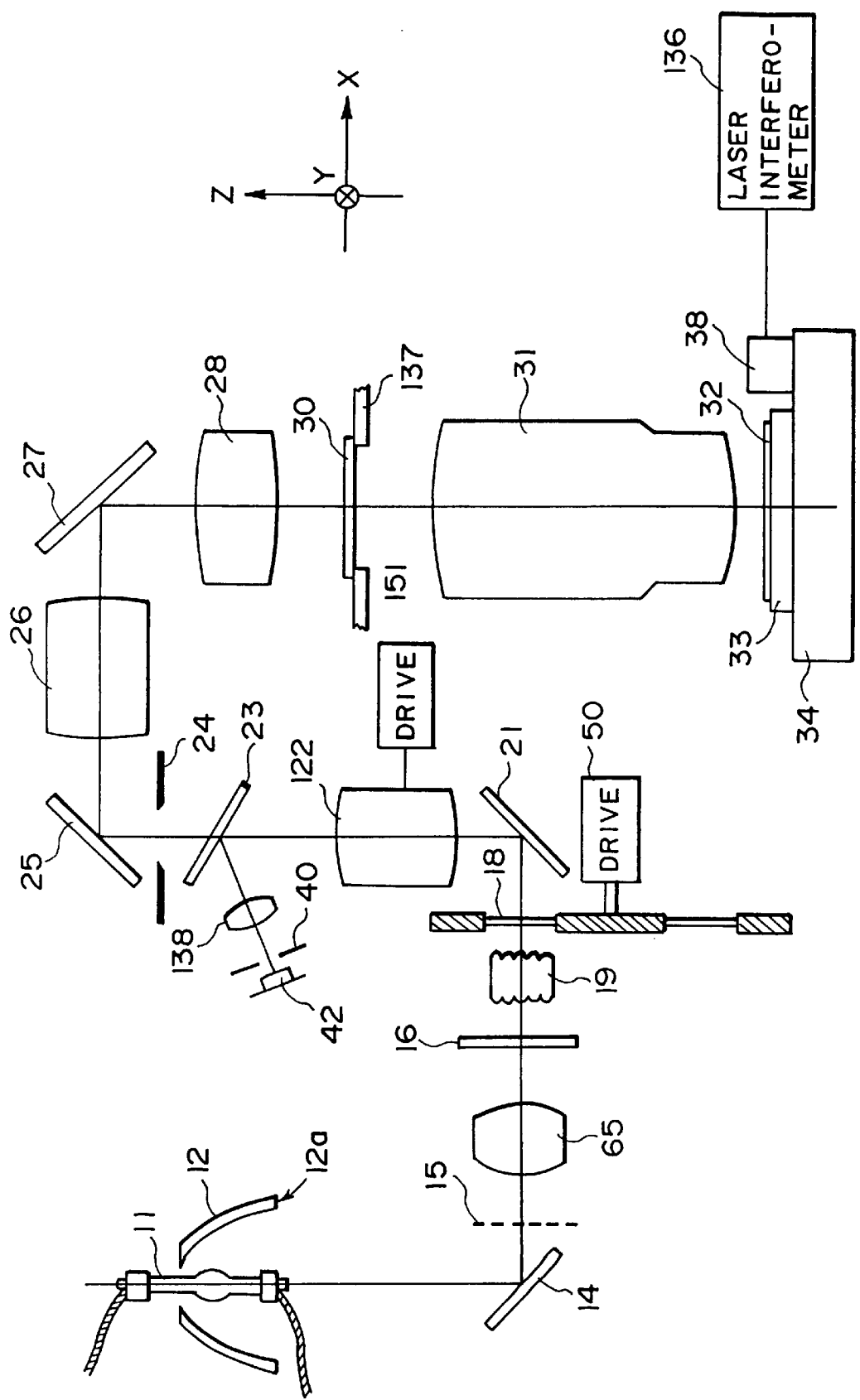
FIG. 20 is a schematic view of a main portion of a projection exposure apparatus according to a still further embodiment of the present invention.

FIG. 20 is a schematic view of a main portion of a further embodiment of the present invention. This embodiment differs from the FIG. 13 embodiment in the structure of a lens system 65, imaging on the optical integrator 19. In this embodiment, the lens system 65 forms an image of the light exit surface of the elliptical mirror 12 on the optical integrator 19. Here, a case wherein a stop such as shown in FIG. 16 is used is considered. What is a problem on this occasion is that there is a difference in maximum effective diameter of light as required on the optical integrator 19, between a case wherein the stop 18a for conventional illumination method as described is used and a case wherein one of the stops 18b–18d for the high-resolution illumination system is used.

In this embodiment, in consideration of this, the lens system 65 is provided by a zoom optical system so as to meet the change in diameter of light. Since the diameter of light from the ultra-high pressure Hg lamp 11 is determined definitely by the light exit portion of the elliptical mirror 12, use of the zoom optical system 65 of this embodiment assures control of the light beam diameter in accordance with an illumination method used. Thus, the light utilization efficiency is improved.

The controllability of the size or the intensity distribution of the light on the optical integrator 19 is important, also in a case wherein the lens system 150 of the FIG. 13 system forms, on the light entrance surface 19a of the integrator 19, an image of the Hg lamp 11, not an image of the light exit portion of the elliptical mirror 12.

Thus, for the control of the light intensity distribution on the integrator 19, the Hg lamp itself may be displaced along the optical axis so that it is defocused with respect to the light entrance surface 19a of the optical integrator 19.

Figure 21:
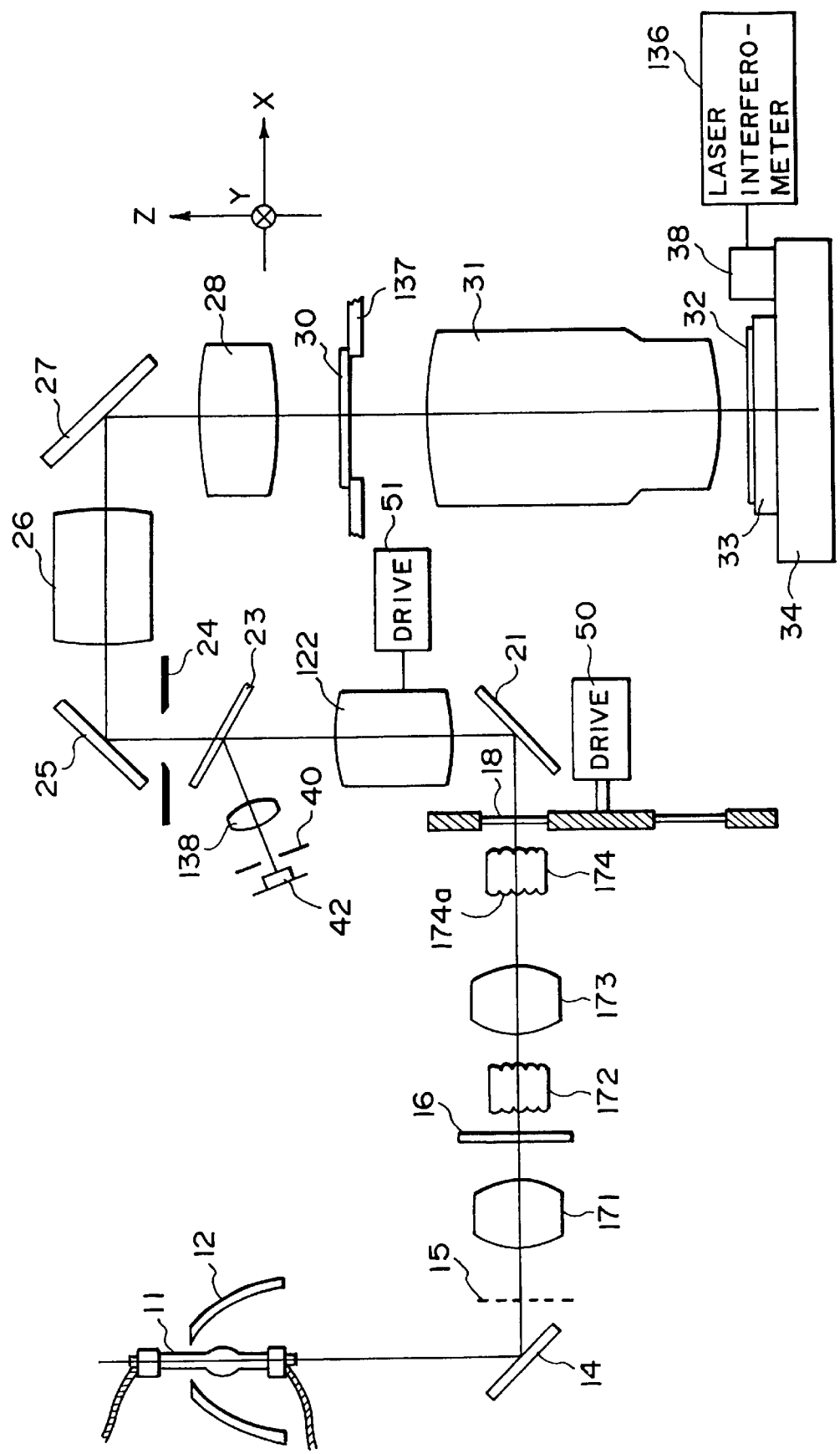
FIG. 21 is a schematic view of a main portion of a projection exposure apparatus according to a still further embodiment of the present invention.

FIG. 21 is a schematic view of a main portion of a further embodiment of the present invention. An important feature of this embodiment resides in that, in order to assure uniform light intensity distribution on the optical integrator as well as even weight of the small lenses, the optical integrator is used in duplex. In the drawing, denoted at 171 is a lens system which corresponds to the lens system 150, denoted at 16 is a wavelength selecting filter, and denoted at 172 is a first optical integrator. In accordance with the function of an optical integrator, light beams emanating from the small lenses constituting the first optical integrator 172 and passing a relay lens 173, are superposed one upon another on a second optical integrator 174. As a result of this, a uniform illuminance distribution is provided on the light entrance surface 174a of the second optical integrator 174.

If in the preceding embodiments a uniform illuminance distribution is not provided on the optical integrator 19 (as an example, the distribution is like a Gaussian distribution wherein the level at the center is high), it is necessary to finally determine the shape of the stop for the high-resolution Illumination on the basis of experiments, for example. In the present embodiment, on the other hand, since the weight (the light quantity supplied therefrom) of the small lenses is even, the contrast of image performance can be controlled easily. Further, in this embodiment, double optical integrators are used, it is not necessary to pay a specific attention to the cable as described with reference to FIGS. 17A and 17B.

Figure 22:
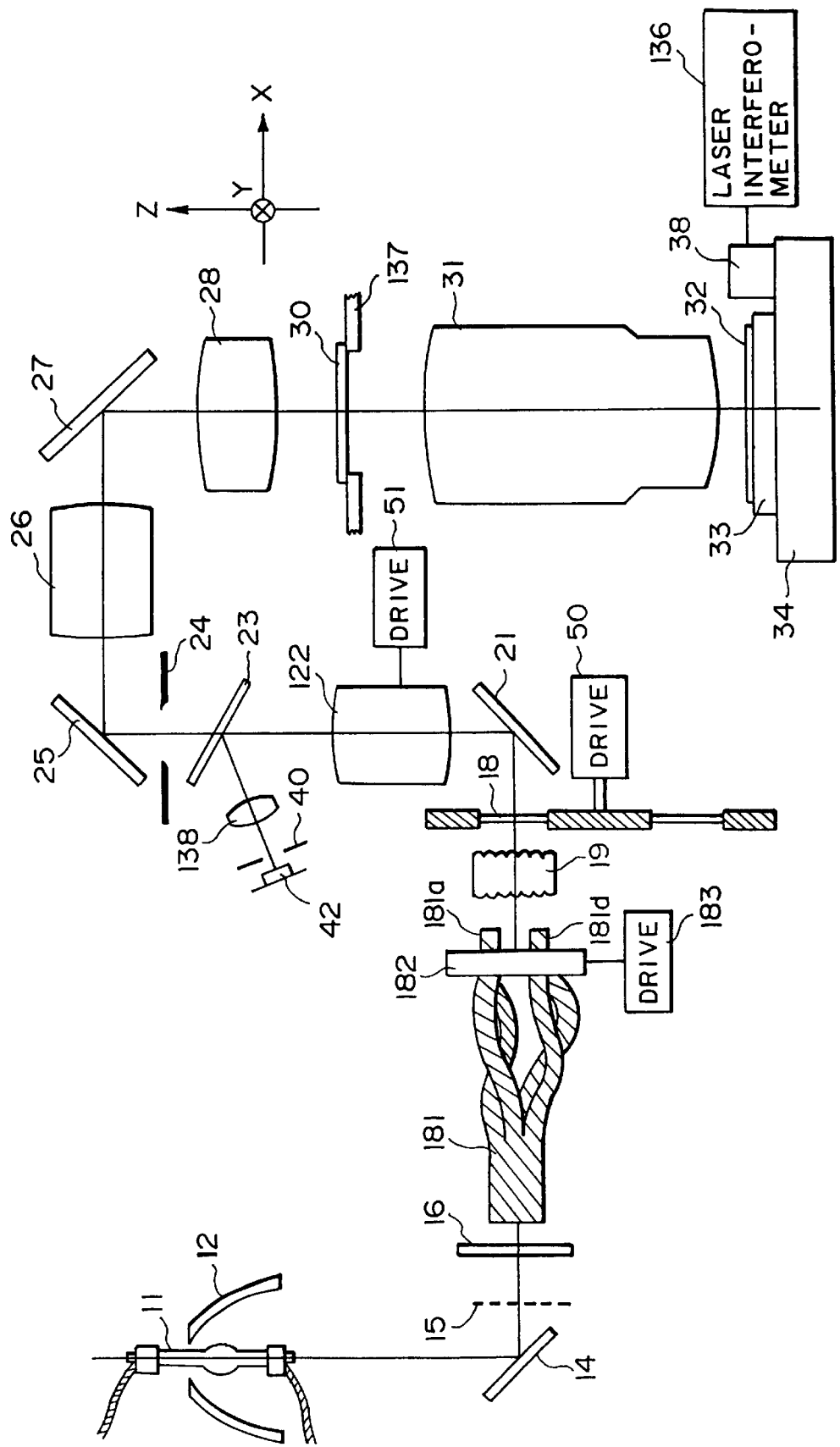
FIG. 22 is a schematic view of a main portion of a projection exposure apparatus according to yet a further embodiment of the present invention.

FIG. 22 is a schematic view of a main portion of a further embodiment of present invention. In this embodiment, a fiber bundle 181 is provided in front of the optical integrator 19. In this example, the zone of the optical integrator to be irradiated is controlled by means of a spacing adjusting mechanism 182 and a driving mechanism 183 therefor, for adjusting the spacing of adjacent end portions of the fiber bundle 181, as branched into four. In order to provide a distribution for a conventional type illumination system, the spacing of the tour fiber bundles 181a–181d is narrowed. In order to provide a distribution corresponding to that shown in FIG. 15A, the spacing of the fiber bundles 181a–181d is widened by a predetermined amount. Such adjustment is effected in accordance with a stop 18 used. In the latter case, rotation of the fiber bundles 181a–181d is also necessary.

In some examples described hereinbefore, one ultra-high pressure Hg lamp having been frequently used is used.

However, as a matter of course, the present invention is applicable also to a case where plural light sources are used or, alternatively, an excimer laser is used as a light source. On an occasion wherein an illumination system uses an excimer laser, It is possible that the position of the laser on the optical integrator is scanned with time. In that case, by changing the range of scan in accordance with the type of a circuit pattern to be printed, an effective light source (image) such as shown in FIG. 15 can be provided easily.

Although it has not been explained with reference to these embodiments, in the high-resolution illumination system the balance of the four portions generally divided by the stop is important. Since details of monitoring the distributions of the four portions of the effective light source or of the manner of correcting the distribution have been described hereinbefore, description of them is omitted here.

Further, while in these embodiments of the present invention the stop means is inserted at a position after the optical integrator, it may be disposed in front of the integrator. As an alternative, if in the illumination system there is a plane which is optically conjugate with the optical integrator, the stop may be disposed on such plane.

In some embodiments of the present invention described hereinbefore, in accordance with the fineness or the directionality, for example, of a pattern on a reticle to be projected and exposed, an illumination system suited to that pattern is selected to thereby assure an optimum exposure method and apparatus of high resolution. Further, these embodiments of the present invention provide an advantage that: for exposure of a pattern which is not very fine, a conventional illumination system can be used as it is; whereas for exposure of a fine pattern, while using an illumination system which assures high resolution with a small loss of light quantity, it is possible to obtain a large depth of focus.

While the invention has been described with reference to the structures disclosed herein, it is not confined to the details set forth and this application is intended to cover such modifications or changes as may come within the purposes of the improvements or the scope of the following claims.

What is claimed is:

1. An exposure apparatus comprising:
   a light source for emitting light;
   providing means for providing, with light from said light source, a secondary light source, having a variable shape;
   projecting means for projecting light from the secondary light source through a mask having a pattern to a substrate to be exposed; and
   adjusting means for adjusting an illuminance distribution on the substrate, in accordance with the variation of the shape of the secondary light source.

2. An apparatus according to claim 1, wherein said projecting means comprises an optical system for illuminating the mask with the light from the light source and an optical system for projecting the mask pattern onto the substrate.

3. An apparatus according to claim 2, wherein said providing means comprises an optical integrator.

4. An apparatus according to claim 3, wherein said providing means comprises a first stop with an aperture on an optical axis and a second stop with an aperture off of the optical axis.

5. An apparatus according to claim 4, wherein said second stop has a plurality of apertures off of the optical axis.

6. An apparatus according to claim 5, wherein said second stop has four apertures.

7. An apparatus according to claim 4, wherein said adjusting means comprises means for moving a lens in said projection means along the optical axis.

8. An exposure apparatus comprising:
   a light source for emitting light;
   providing means for providing, with light from said light source, a secondary light source, having a variable shape;
   projecting means for projecting the light from the secondary light source onto a substrate through a mask having a pattern; and
   changing means for changing an illuminance non-uniformity on the mask, in accordance with the variation in the shape of the secondary light source.

9. An apparatus according to claim 8, wherein said projecting means comprises an optical system for illuminating the mask with the light from the light source and an optical system for projecting the mask pattern on the substrate.

10. An apparatus according to claim 9, wherein said providing means comprises an optical integrator and an aperture stop, through both of which the light source is formed.

11. An apparatus according to claim 10, wherein said aperture stop comprises a first stop with an aperture on an optical axis and a second stop with an aperture off of the optical axis.

12. An apparatus according to claim 11, wherein said second stop has a plurality of apertures off of the optical axis.

13. An apparatus according to claim 12, wherein said second stop has four apertures.

14. An apparatus according to claim 12, wherein said changing means comprises means for moving a lens of said projecting means in the direction of the optical axis.

15. A projection exposure apparatus comprising:
    a light source for producing light;
    an optical integrator for receiving the light from said light source;
    a first optical system for directing the light from said light source to said optical integrator to form a secondary light source;
    aperture stop means for defining a shape of the secondary light source, said aperture stop means comprising a plurality of aperture stops having different aperture shapes, respectively, the shape of the secondary light source being defined by providing one of the aperture stops into an optical path of said light source;
    a second optical system for illuminating a mask with the light from the secondary light source;
    a projection optical system for projecting a pattern of the mask, illuminated by said second optical system, onto a substrate; and
    adjusting means for adjusting an illuminance distribution on the substrate, in accordance with an exchange of the aperture stop.

16. A projection exposure apparatus comprising:
    a light source for producing light;
    an optical integrator for receiving the light from said light source;
    a first optical system for directing the light from said light source to said optical integrator to form a secondary light source;
    aperture stop means for defining a shape of the secondary light source, said aperture stop means comprising a plurality of aperture stops having different aperture shapes, respectively, the shape of the secondary light source being defined by providing one of the aperture stops into an optical path of said light source;

a second optical system for illuminating a mask with the light from the secondary light source;

a projection optical system for projecting a pattern of the mask, illuminated by said second optical system, onto a substrate; and changing means for changing an illuminance non-uniformity on the mask, in accordance with an exchange of the aperture stop.

17. A device manufacturing method including a step of transferring a device pattern of a mask onto a substrate by illuminating the mask with light from a light source, said method comprising the steps of:

emitting light from a light source;

providing, with light from the light source, a secondary light source having a variable shape; and adjusting an illuminance distribution on the substrate, in accordance with the variation of the shape of the secondary light source.

18. A method according to claim 17, further comprising projecting the illuminated device pattern onto the substrate through a projecting optical system.

19. A method according to claim 18, further comprising forming the light source by an optical integrator and one of a plurality of aperture stops.

20. A method according to claim 19, further comprising changing the intensity distribution of the light source by changing the one aperture stop with another one of the aperture stops.

21. A method according to claim 20, further comprising providing the plurality of aperture stops with a first aperture on an optical axis and a second aperture off of the optical axis.

22. A method according to claim 21, further comprising providing the second aperture stop with four openings off of the optical axis.

23. A method according to claim 22, wherein said changing step comprises moving a lens in a direction of the optical axis to direct the light from the light source toward the mask.

24. A device manufacturing method including a step of transferring a device pattern of a mask onto a substrate by illuminating the mask with light from a light source, said method comprising the steps of:

emitting light from a light source;

providing, with light from the light source, a secondary light source having a variable shape; and changing an illuminance non-uniformity distribution on the mask, in accordance with the change in the shape of the light source.

25. A method according to claim 24, further comprising projecting the illuminated device pattern onto the substrate by a projection optical system.

26. A method according to claim 25, wherein said providing step comprises providing the light source by an optical integrator and one of a plurality of aperture stops.

27. A method according to claim 26, further comprising varying the shape of the light source by changing the one aperture stop with another one of the aperture stops.

28. A method according to claim 27, further comprising providing one of the aperture stops with an aperture on an optical axis and the other with an aperture off of the optical axis.

29. A method according to claim 28, further comprising providing the second aperture stop with four openings off of the optical axis.

30. A method according to claim 29, wherein said changing step comprises moving a lens for directing the light from the light source toward the mask in a direction of the optical axis.

31. A device manufacturing method comprising:

producing light by a light source;

receiving the light from the light source by an optical integrator;

directing the light from the light source to the optical integrator, using a first optical system, to form a secondary light source;

defining a shape of the secondary light source using aperture stop means, the aperture stop means having a plurality of aperture stops having different aperture shapes, respectively, and defining the shape of the secondary light source by providing one of the aperture stops into an optical path of the light source;

illuminating a mask with the light from the secondary light source using a second optical system;

projecting a pattern of the mask illuminated by the second optical system, onto a substrate, using a projection optical system;

adjusting an illuminance distribution on the substrate using adjusting means, in accordance with an exchange of the aperture stop; and transferring the pattern of the mask onto the substrate.

32. A device manufacturing method comprising:

producing light by a light source;

receiving the light from the light source by an optical integrator;

directing the light from the light source to the optical integrator, using a first optical system, to form a secondary light source;

defining a shape of the secondary light source using aperture stop means, the aperture stop means having a plurality of aperture stops having different aperture shapes, respectively, and defining the shape of the secondary light source by providing one of the aperture stops into an optical path of the light source;

illuminating a mask with the light from the secondary light source using a second optical system;

projecting a pattern of the mask illuminated by the second optical system, onto a substrate, using a projection optical system;

changing an illuminance non-uniformity on the mask using adjusting means, in accordance with an exchange of the aperture stop; and transferring the pattern of the mask onto the substrate.

* * * * *

UNITED STATES PATENT AND TRADEMARK OFFICE
CERTIFICATE OF CORRECTION

PATENT NO. : 6,271,909 B1
DATED : August 7, 2001
INVENTOR(S) : Akiyoshi Suzuki et al.

It is certified that error appears in the above-identified patent and that said Letters Patent is hereby corrected as shown below:

<u>Title page,</u>
Item [56], References Cited, FOREIGN PATENT DOCUMENTS, the following should be inserted:

| | | | |
|---|---|---|---|
| -- | 4-225357 | 8/1992 | Japan |
| | 4-225358 | 81992 | Japan |
| | 4-225359 | 8/1992 | Japan |
| | 4-180612 | 6/1992 | Japan --. |

OTHER PUBLICATIONS, the following should be inserted:

-- Robertson, et al., "Proximity effects and influences of nonuniform illumination in projection lithography", <u>SPIE</u>, Vol. 334, Optical Microlithography-Technology for the Mid-1980s (1982), pp. 37-43.
Basic and Application of Optical System Theory ($7^{th}$), January 11 and 12, 1991, SEIKEN Seminar Text, Course 161, pages 45 to 48.
Rosenbluth, et al., "A critical examination of submicron optical litography using simulated projection images", <u>J. Vac. Sci. Technol.</u>, B1(4), Oct.-Dec. 1983, pp. 1190-1195.
Jeanne Roussel, "Step-and-Repeat Wafer Imaging", <u>Solid State Technology</u>, May 1978, pp. 67-71. --

<u>Column 1,</u>
Line 58, "RP = $_1\lambda$N.A.," should read -- RP = $\lambda$/N.A., --.

<u>Column 2,</u>
Line 3, "developed." should read -- been developed --.

<u>Column 4,</u>
Line 42, "or in" should read -- on --.

<u>Column 8,</u>
Line 19, "In" should read -- in --;
Line 38, "If" should read -- if --.

<u>Column 10,</u>
Line 30, "be" should be deleted; and
Line 62, "stage, not shown." should read -- stage (not shown). --.

UNITED STATES PATENT AND TRADEMARK OFFICE
CERTIFICATE OF CORRECTION

PATENT NO. : 6,271,909 B1
DATED : August 7, 2001
INVENTOR(S) : Akiyoshi Suzuki et al.

It is certified that error appears in the above-identified patent and that said Letters Patent is hereby corrected as shown below:

Column 12,
Line 47, "than" should read -- then --; and
Line 50, "Integrator" should read -- integrator --.

Column 13,
Line 39, "corresponding" should read -- corresponding to --.

Column 14,
Line 12, "Of" should read -- of --; and
Line 25, "plans" should read -- plane --.

Column 16,
Line 39, "is" should read -- , which is --.

Column 18,
Line 37, "of" should be deleted.

Column 19,
Line 18, "Image" should read -- image --; and
Line 44, "Image" should read -- image --.

Column 20,
Line 24, "it in" should read -- it is --.

Column 21,
Line 16, "Is" should read -- is --;
Line 51, "Is" should read --is --; and
Line 62, "bf" should read -- of --.

Column 22,
Line 51, "beaus" should read -- beams --; and
Line 53, "drawing," should read -- drawings, --.

Column 23,
Line 13, "an" should read -- as --;
Line 38, "Illustrated." should read -- illustrated. --; and
Line 62, "Is" should read -- is --.

UNITED STATES PATENT AND TRADEMARK OFFICE
CERTIFICATE OF CORRECTION

PATENT NO. : 6,271,909 B1
DATED : August 7, 2001
INVENTOR(S) : Akiyoshi Suzuki et al.

It is certified that error appears in the above-identified patent and that said Letters Patent is hereby corrected as shown below:

Column 24,
Line 16, "sire" should read -- size --.

Column 25,
Line 53, "or" should read -- of --; and
Line 55, "pyramid-lime" should read -- pyramid-like --.

Column 26,
Line 43, "Illumination" should read -- illumination --; and
Line 60, "tour" should read -- four --.

Column 27,
Line 5, "It" should read -- it --.

Signed and Sealed this

Fifth Day of November, 2002

Attest:

JAMES E. ROGAN
Attesting Officer    Director of the United States Patent and Trademark Office